(12) United States Patent
Okita

(10) Patent No.: US 11,198,161 B2
(45) Date of Patent: Dec. 14, 2021

(54) CLEANING DEVICE FOR MONOCRYSTAL PULLING APPARATUS

(71) Applicant: SUMCO CORPORATION, Tokyo (JP)

(72) Inventor: Kenji Okita, Tokyo (JP)

(73) Assignee: SUMCO CORPORATION, Tokyo (JP)

( * ) Notice: Subject to any disclaimer, the term of this patent is extended or adjusted under 35 U.S.C. 154(b) by 0 days.

(21) Appl. No.: 16/480,426

(22) PCT Filed: Feb. 2, 2017

(86) PCT No.: PCT/JP2017/003797
§ 371 (c)(1),
(2) Date: Jul. 24, 2019

(87) PCT Pub. No.: WO2018/142541
PCT Pub. Date: Aug. 9, 2018

(65) Prior Publication Data
US 2019/0388943 A1    Dec. 26, 2019

(51) Int. Cl.
*B08B 9/08*    (2006.01)
*B08B 1/00*    (2006.01)
(Continued)

(52) U.S. Cl.
CPC .............. *B08B 9/08* (2013.01); *B08B 1/001* (2013.01); *B08B 5/02* (2013.01); *B08B 5/04* (2013.01);
(Continued)

(58) Field of Classification Search
CPC .. B08B 9/08; B08B 1/001; B08B 5/02; B08B 5/04; B08B 9/027; B08B 5/023; C30B 15/32; C30B 29/06; C30B 35/00
(Continued)

(56) References Cited

U.S. PATENT DOCUMENTS 6,090,222 A * 7/2000 Ivey .................... B08B 5/00
134/18
8,739,362 B1 * 6/2014 Conder ............... E04D 13/0765
15/406
(Continued)

FOREIGN PATENT DOCUMENTS

JP     2000-219591 A    8/2000
JP     2001-348293      12/2001
(Continued)

OTHER PUBLICATIONS

JP-2001348293-A, Machine generated translation, created via IP.com, Nov. 23, 2020. (Year: 2020).*
(Continued)

*Primary Examiner* — Nadine G Norton
*Assistant Examiner* — Christopher Remavege
(74) *Attorney, Agent, or Firm* — Greenblum & Bernstein, P.L.C.

(57) ABSTRACT

A cleaning device for cleaning the inside of a monocrystal pulling apparatus includes a main tube part that is capable of being inserted into a pull chamber and a wire cleaning mechanism that is provided at an upper portion of the main tube part and is configured to clean a pulling wire to be inserted into the main tube part. The main tube part includes a continuous extension mechanism that adds together and joins a plurality of joint tube parts in an axial direction and allows the plurality of joint tube parts to be sealed and connected to each other. Accordingly, the cleaning device is configured to efficiently clean the wire by preventing powdery dust from adhering thereto again.

19 Claims, 13 Drawing Sheets

(51) Int. Cl.
  *B08B 5/02*    (2006.01)
  *B08B 5/04*    (2006.01)
  *B08B 9/027*   (2006.01)
  *C30B 29/06*       (2006.01)
  *C30B 15/32*       (2006.01)
  *C30B 35/00*       (2006.01)

(52) U.S. Cl.
  CPC .............. *B08B 9/027* (2013.01); *C30B 15/32* (2013.01); *C30B 29/06* (2013.01); *C30B 35/00* (2013.01)

(58) Field of Classification Search
  USPC ........ 15/300.1, 301, 312.1, 312.2, 314, 315, 15/316.1, 345; 134/21, 22.11, 22.12, 134/22.18, 24, 22.1
  See application file for complete search history.

(56) References Cited

U.S. PATENT DOCUMENTS

| | | | | |
|---|---|---|---|---|
| 8,757,669 | B2 * | 6/2014 | Chou | F16L 19/065 |
| | | | | 285/302 |
| 9,738,992 | B2 * | 8/2017 | Okita | C30B 35/00 |

FOREIGN PATENT DOCUMENTS

| | | | | | |
|---|---|---|---|---|---|
| JP | 2001-348295 | A | | 12/2001 | |
| JP | 2001348293 | A | * | 12/2001 | |
| JP | 2002-160994 | A | | 6/2002 | |
| JP | 2011-32142 | | | 2/2011 | |
| JP | 2015006642 | A | * | 1/2015 | |
| KR | 2011109435 | A1 | * | 1/2011 | ............. C30B 15/00 |
| WO | WO 2016/125605 | A1 | | 8/2016 | |

OTHER PUBLICATIONS

KR2011109435A1, Machine Translation via Espacenet. (Year: 2021).*
Office Action for CN App. No. 201780085144.3 dated Oct. 12, 2020 (w/ partial translation).
International Search Report issued in International Patent Application No. PCT/JP2017/003797, dated Mar. 7, 2017; and English-language translation thereof.
International Preliminary Report on Patentability for International Patent Application No. PCT/JP2017/003797, dated Aug. 6, 2019.
Written Opinion for International Patent Application No. PCT/JP2017/003797, dated Mar. 7, 2017; and English-language translation thereof.
Office Action for KR App. No. 10-2019-7021831, dated Sep. 3, 2020 (w/ translation).
Notice of Allowance for KR App. No. 10-2019-7021831, dated Mar. 25, 2021 (w/ translation).
Office Action for CN App. No. 201780085144.3, dated Apr. 19, 2021 (w/ translation).
Unknown (by the Study Group on this project), "Investigation Report on Offshore Oil Drilling, Exploitation, Collection and Transportation Equipment in Britain, the Netherlands and Denmark,", Technical Information institute of the First Ministry of Machinery Industry, p. 61, Jan. 1979 (relevance discussed in CN Office Action (cite No. C01)).

* cited by examiner

CLEANING DEVICE FOR MONOCRYSTAL PULLING APPARATUS

TECHNICAL FIELD

The present invention relates to a cleaning device for a monocrystal pulling apparatus, and more particularly, to a technique that is suitably used to clean the inside of a monocrystal pulling apparatus for pulling a semiconductor monocrystal, such as a silicon monocrystal, from a semiconductor melt stored in a crucible by a wire using Czochralski method (CZ method).

BACKGROUND ART

Generally, a monocrystal pulling apparatus using CZ method is known as one of methods for growing a semiconductor monocrystal, such as silicon (Si) or gallium arsenide (GaAs). To perform pull and growth of the monocrystal in the monocrystal pulling apparatus, first, semiconductor melt is stored in a quartz crucible disposed in a chamber, which is a sealed vessel, and the heating of the semiconductor melt up to a predetermined temperature is controlled by a heater disposed around the quartz crucible.

Then, a semiconductor monocrystal is pulled from the semiconductor melt, which is stored in the quartz crucible disposed below the pull chamber, by a wire (tungsten or the like) that is suspended in a pull chamber provided at the upper portion of the chamber.

Such a monocrystal pulling apparatus includes a winding device for the wire pulling a semiconductor monocrystal. The winding device is provided in a pull head that is rotatably provided on the pull chamber. That is, the wire is suspended into the pull chamber from the pull head through a centerpiece portion that is a hole allowing the pull head and the pull chamber to communicate with each other.

CITATION LIST

Patent Document

[Patent Document 1] Japanese Unexamined Patent Application Publication No. 2011-32142

SUMMARY OF INVENTION

Technical Problem

There is a concern that adhering matter, such as vapor of Si, is generated on the inner surface of the pull chamber during pull and growth of a monocrystal and the adhering matter fails as powdery dust in the monocrystal pulling apparatus. Further, there is a case where powdery dust is generated from the wire when the wire is wound by a winding device. Since the powdery dust affects pull and growth of the monocrystal and causes the dislocation of a monocrystal, there is a concern that the powdery dust causes a crystal-pulling property to deteriorate. However, since the pull chamber and the wire are positioned at the upper portion of the monocrystal pulling/growing apparatus, the pull chamber and the wire are present at a high position. Accordingly, it is difficult to perform cleaning to remove powdery dust, which adheres to the surfaces of the pull chamber and the wire, in manual work and the like.

In a technique disclosed in Patent Document 1, the inside of the chamber is contaminated again with powdery dust generated during the cleaning of a wire. For this reason, there is a problem that dislocation is likely to occur. In addition, since a wire cleaning device is present in the chamber where pull is to be performed, the vapor of Si and the like adhere to the wire cleaning device in a process where the amount of silicon to be vaporized is large. For this reason, the wire cleaning device is likely to cause dislocation. Particularly, since the diameter of the quartz crucible has been increased in recent years, the amount of adhering matter, such as the vapor of Si, to be generated has also increased.

Further, there is a case where powdery dust is generated while the quartz crucible is filled with a silicon raw material. The powdery dust adheres to the wire or the inside of the pull chamber and is likely to cause dislocation. For this reason, there is a request for cleaning the wire while the quartz crucible is filled with a silicon raw material.

The invention has been made in consideration of the above-mentioned circumstances, and an object of the invention is to provide cleaning device for a monocrystal pulling apparatus that easily cleans the inner surface of a pull chamber or easily cleans a wire suspended in a pull chamber to remove powdery dust present in a monocrystal pulling apparatus and can suppress the occurrence of dislocation.

Solution to Problem

The object is achieved by a cleaning device for a monocrystal pulling apparatus of the invention for cleaning an inside of a monocrystal pulling apparatus that is configured to pull a semiconductor monocrystal from semiconductor melt stored in a crucible installed below a pull chamber by a wire suspended in the pull chamber of a sealed vessel. The cleaning device includes a main tube part that is capable of being inserted into the pull chamber, and a wire cleaning mechanism that is provided at an upper portion of the main tube part and is configured to clean the wire to be inserted into the main tube part. The main tube part includes a continuous extension mechanism that adds together and joins a plurality of joint tube parts in an axial direction and allows the plurality of joint tube parts to be sealed and connected to each other.

The wire cleaning mechanism of the invention may include an internal air-blowing mechanism that is capable of blowing air inward in a radial direction from an internal blowing port provided in the main tube part.

The internal air-blowing mechanism of the invention may be provided to be flush with an inner surface of the main tube part.

The main tube part of the invention may include an external communication-suction portion that is provided above the internal air-blowing mechanism and communicates with an outside of the main tube part.

A gas suction pipe, which which is configured to suck air present in the main tube part and discharges the air, may be provided at a position of a lower end of the main tube part of the invention.

A sealing member, which is capable of being in contact with an inner surface of the pull chamber and sealing an upper end side of the pull chamber in a state where the main tube part is inserted into the pull chamber during blowing of air from the internal blowing port, may be provided on an outer peripheral surface of an upper end of the main tube part of the invention.

The first Joint tube pam of the invention may include a variable diameter mechanism that is configured to reduce the diameter of the first joint tube part when the sealing member is to be moved in the radial direction of the main tube part and increases the diameter of the sealing member when the sealing member seals the upper end side of the pull chamber.

The variable diameter mechanism of the invention may include a flexible bag body that is provided between the sealing member and an outer peripheral surface of the main tube part, and the flexible bag body is capable of being inflated by an injection of air.

The flexible bag body of the invention may be a rubber tube that is provided in an annular shape along the outer peripheral surface of the main tube part.

An outer peripheral portion of the sealing member of the invention may slide on the inner surface of the pull chamber and clean the inner surface of the pull chamber.

The continuous extension mechanism of the invention may include tube support portions that protrude in a radial direction at positions of lower ends of the respective joint tube parts of the main tube part, and a support base that supports the tube support portions when the joint tube parts are added together and joined.

The object is achieved by a cleaning method for a monocrystal pulling apparatus of the invention, of cleaning a wire of the monocrystal pulling apparatus pulling a semiconductor monocrystal from semiconductor melt stored in a crucible installed below a pull chamber by a wire suspended in the pull chamber of a sealed vessel. The cleaning method includes: inserting a main tube part, of which a plurality of joint tube parts of a cleaning device are added together and joined in an axial direction and are allowed to be sealed and connected to each other, into the pull chamber; and cleaning the wire by blowing air inward in a radial direction from an internal blowing port of an internal air-blowing mechanism provided in the main tube part in a state where the wire is inserted into an upper portion of the main tube part.

In the cleaning method for a monocrystal pulling apparatus of the invention, the continuous extension mechanism includes tube support portions that protrude in the radial direction at positions of lower ends of the respective joint tube parts of the main tube part and a support base that supports the tube support portions when the joint tube parts are added together and joined, and the main tube part may be added and joined to or separated from the pull chamber while the tube support portions are supported by the support base.

In the cleaning method for a monocrystal pulling apparatus of the invention, air may be blown from the internal blowing port in a state where the main tube part is inserted into the pull chamber and a sealing member provided on an outer peripheral surface of an upper end of the main tube part is in contact with an inner surface of the pull chamber and seals the upper end side of the pull chamber.

In the cleaning method for a monocrystal pulling apparatus of the invention, air present in the main tube part may be sucked from a lower end of the main tube part, and air may be blown from an external communication-suction portion that is provided above the internal blowing port and communicates with an outside of the main tube part.

In the cleaning method for a monocrystal pulling apparatus of the invention, an outer peripheral portion of the sealing member may slide and clean the inner surface of the pull chamber in a state where the sealing member is in contact with the inner surface of the pull chamber, and seal the upper end side of the pull chamber.

A cleaning device for a monocrystal pulling apparatus of the invention configured to clean an inside of a monocrystal pulling apparatus that is configured to pull a semiconductor monocrystal from semiconductor melt stored in a crucible installed below a pull chamber by a wire suspended in the pull chamber of a sealed vessel. The cleaning device includes a main tube part that is capable of being inserted into the pull chamber, and a wire cleaning mechanism that is provided at an upper portion of the main tube part and is configured to clean the wire to be inserted into the main tube part. The main tube part includes a continuous extension mechanism that adds together and joins a plurality of joint tube parts in an axial direction and allows the plurality of joint tube parts to be sealed and connected to each other. Accordingly, when the wire is to be cleaned at a position in the pull chamber, the upper portion of the main tube part where the wire cleaning mechanism is disposed reaches the vicinity of a top portion of the pull chamber and the lower end of the sealed main tube part can be positioned outside the pull chamber. Therefore, powdery dust generated due to cleaning is sucked into the sealed main tube part and the leakage of the powdery dust to a space between the main tube part and the pull chamber is prevented, so that the powdery dust can be removed without adhering to the inner surface of the pull chamber. Accordingly, dislocation, which is caused by powdery dust adhering again, can be prevented and pullable cleaning of the monocrystal can be performed.

The wire cleaning mechanism of the invention includes an internal air-blowing mechanism that is capable of blowing air inward in a radial direction from an internal blowing port provided in the main tube part. Accordingly, the main tube part is inserted into the pull chamber, the wire is suspended in the main tube part, and air is blown to the wire, which corresponds to the inside in the radial direction, from the internal blowing port by the internal air-blowing mechanism, so that it is possible to perform the cleaning of the wire for blowing off and removing powdery dust from the surface of the wire and to prevent the powdery dust, which has been blown off, from adhering to the inner surface of the pull chamber, which is positioned outside the main tube part, again.

It is preferable that the internal air-blowing mechanism includes a plurality of the internal blowing ports. That is, since air is blown to the wire from, for example, a plurality of internal blowing ports, which are arranged in the circumferential direction and the axial direction, in this cleaning device, the surface of the wire can be cleaned in a wide range in the circumferential direction and the axial direction.

The internal air-blowing mechanism of the invention is provided to be flush with an inner surface of the main tube part. Accordingly, when the wire is to be moved forward and backward in the main tube part, the occurrence of contamination, which affects dislocation, on the wire or the seed chuck and the like caused by the contact between the wire or the seed chuck and the like provided at the tip of the wire and the inside of the main tube part is prevented. As a result, cleaning can be efficiently performed.

Since the main tube part of the invention includes an external communication-suction portion that is provided above the internal air-blowing mechanism and communicates with an outside of the main tube part, air can be blown into the main tube part from the external communication-suction portion. Accordingly, air, which is jetted from the external communication-suction portion toward the inside of the main tube part, forms, so to speak, an air curtain, and blocks the movement of powdery dust, which is generated near the internal air-blowing mechanism due to cleaning, to a position above the internal air-blowing mechanism. As a result, it is possible to prevent the powdery dust from adhering to the pull chamber again.

A gas suction pipe, which is configured to suck air present in the main tube part and discharges the air, is provided at a position of a lower end of the main tube part of the invention. Accordingly, powdery dust, which is generated near the internal air-blowing mechanism due to cleaning, is sucked into the sealed main tube part and is collected outside from the lower end of the main tube part, and the leakage of the powdery dust to the upper side of the main tube part and a space between the main tube part and the pull chamber is prevented. As a result, the powdery dust can be removed without adhering to the inner surface of the pull chamber.

A sealing member, which is capable of being in contact with an inner surface of the pull chamber and sealing the upper end side of the pull chamber in a state where the main tube part is inserted into the pull chamber during blowing of air from the internal blowing port, is provided on an outer peripheral surface of an upper end of the main tube part of the invention. Accordingly, cleaning can be performed so that generated powdery dust does not enter a space between the main tube part and a portion of the pull chamber positioned below a position where the sealing member is in contact the pull chamber. Therefore, it is possible to reliably prevent powdery dust from entering the space formed outside the outer periphery of the main tube part.

In addition, it is preferable that the sealing member is provided in an annular shape along the inner peripheral surface of the pull chamber. That is, since the sealing member is provided in an annular shape along the inner peripheral surface of the pull chamber in the cleaning device, the sealing member is in contact with the entire inner surface of the pull chamber in the circumferential direction. Accordingly, the sealing member can easily seal the entire inner peripheral surface of the pull chamber.

The first joint tube part of the invention includes a variable diameter mechanism that is configured to reduce a diameter of the first joint tube part when the sealing member is to be moved in the radial direction of the main tube part and increases the diameter of the sealing member when the sealing member seals the upper end side of the pull chamber. Accordingly, it is possible to freely allow the sealing member to be in contact with or to be spaced apart from the inner peripheral surface of the pull chamber by deforming or moving the sealing member in the radial direction of the main tube part. Therefore, the main tube part can be inserted into the pull chamber without being in contact with the pull chamber and the upper end of the main tube part can be raised and lowered in a state where the sealing member is reduced in diameter; and the sealing member can be in contact with the inner surface of the pull chamber and seal the upper end portion of the pull chamber and cleaning can be performed so that powdery dust is not dispersed, in a state where the sealing member is increased in diameter. It is possible to smoothly insert the main tube part into the pull chamber or to smoothly take the main tube part out of the pull chamber without the obstruction of the sealing member in a case where the main tube part is to be inserted into and set in the pull chamber or is to be taken out of the pull chamber.

The variable diameter mechanism of the invention includes a flexible bag body that is provided between the sealing member and an outer peripheral surface of the main tube part, and the flexible bag body is capable of being inflated by an injection of air. Accordingly, the sealing member can be easily deformed or moved by only simple method, such the inflation of the flexible bag body, in a case where the main tube part is to be inserted into the pull chamber and the upper end of the main tube part is to be raised and lowered, and the like; and the sealing member can be made not to be in contact with the pull chamber in cases other than case where the sealing member is to be made to be in contact with the inner surface of the pull chamber. In a case where air is injected into the flexible bag body to inflate the flexible bag body in a state where the main tube part is inserted into the pull chamber, the sealing member disposed outside the flexible bag body is moved or deformed outward in the radial direction and can be made to be in contact with the inner peripheral surface of the pull chamber. Accordingly, the sealing member can be easily deformed or moved by only simple method, such the inflation of the flexible bag body.

Since the flexible bag body of the invention is a rubber tube that is provided in an annular shape along the outer peripheral surface of the main tube part, the flexible bag body can be easily inflated over the entire outer periphery of the main tube part. Accordingly, the sealing member can be deformed or moved over the entire outer periphery of the main tube part.

An outer peripheral portion of the sealing member of the invention can slide on the inner surface of the pull chamber and clean the inner surface of the pull chamber. Accordingly, it is possible to move the sealing member while wiping the inner surface of the pull chamber by sealing the upper end side of the pull chamber with the sealing member before the cleaning of the wire and lowering the upper end of the main tube part while the sealing member is in contact with the inner surface of the pull chamber after the cleaning of the wire. Therefore, the sealing member can slide on the inner surface of the pull chamber and scrape adhering matter off. Accordingly, the inner surface of the pull chamber can be cleaned as a whole after the cleaning of the wire.

The continuous extension mechanism of the invention includes tube support portions that protrude in a radial direction at positions of lower ends of the respective joint, tube parts of the main tube part, and a support base that supports the tube support portions when the joint tube parts are added together and joined. Accordingly, when the main tube part is to be inserted into and taken out of the pull chamber, it is possible to reduce work time by efficiently attaching/detaching the joint tube parts and to easily prevent the occurrence of the contact between the main tube part and the inner surface of the pull chamber.

Further, it is preferable that the wire cleaning mechanism of the cleaning device for a monocrystal pulling apparatus of the invention includes a vibrating member provided on the inner surface of the main tube part, being in contact with the wire disposed in the main tube part, and applying vibration to the wire. That is, since the vibrating member is in contact with the wire disposed in the main tube part in the cleaning device, the wire is vibrated and adhering powdery dust can be made to more easily fall.

A cleaning method for a monocrystal pulling apparatus of the invention, of cleaning a wire of a monocrystal pulling apparatus pulling a semiconductor monocrystal from semiconductor melt stored in a crucible installed below a pull chamber by a wire suspended in the pull chamber of a sealed vessel. The cleaning method includes: inserting a main tube part, of which a plurality of joint tube parts of a cleaning device are added together and joined in an axial direction and are allowed to be sealed and connected to each other, into the pull chamber; and cleaning the wire by blowing air inward in a radial direction from an internal blowing port of an internal air-blowing mechanism provided in the main tube part in a state where the wire is inserted into an upper portion of the main tube part. Accordingly, the upper portion of the main tube part where the internal air-blowing mechanism is disposed reaches the vicinity of a top portion of the pull chamber and the lower end of the sealed main tube part can be positioned outside the pull chamber. Therefore, powdery dust generated due to cleaning is sucked into the sealed main tube part and the leakage of the powdery dust to a space between the main tube part and the pull chamber is prevented, so that the powdery dust can be removed without adhering to the inner surface of the pull chamber. Accordingly, dislocation, which is caused by powdery dust adhering again, can be prevented and pullable cleaning of the monocrystal can be performed.

In the cleaning method for a monocrystal pulling apparatus of the invention, the continuous extension mechanism includes tube support portions that protrude in the radial direction at positions of lower ends of the respective joint tube parts of the main tube part and a support base that supports the tube support portions when the joint tube parts are added together and joined, and the main tube part is added and joined to or separated from the pull chamber while the tube support portions are supported by the support base. Accordingly, when the main tube part is to be inserted into and taken out of the pull chamber, it is possible to reduce work time by efficiently attaching/detaching the joint tube parts and to easily prevent the occurrence of the contact between the main tube part and the inner surface of the pull chamber.

In the cleaning method for a monocrystal pulling apparatus of the invention, air is blown from the internal blowing port in a state where the main tube part is inserted into the pull chamber and a sealing member provided on an outer peripheral surface of an upper end of the main tube part is in contact with an inner surface of the pull chamber and seals the upper end side of the pull chamber. Accordingly, cleaning can be performed so that generated powdery dust does not enter a space between the main tube part and a portion of the pull chamber positioned below a position where the sealing member is in contact the pull chamber. Therefore, it is possible to reliably prevent powdery dust from entering the space formed outside the outer periphery of the main tube part.

In the cleaning method for a monocrystal pulling apparatus of the invention, air present in the main tube part is sucked from a lower end of the main tube part, and air is blown from an external communication-suction portion that is provided above the internal blowing port and communicates with an outside of the main tube part. Accordingly, air, which is jetted from the external communication-suction portion toward the inside of the main tube part, forms, so to speak, an air curtain and blocks the movement of powdery dust, which is generate near the internal air-blowing mechanism due to cleaning, to a position above the internal air-blowing mechanism; powdery dust, which is generated near the internal air-blowing mechanism due to cleaning, is sucked into the sealed main tube part and is collected outside from the lower end of the main tube part; and the leakage of the powdery dust to the upper side of the main tube part and a space between the main tube part and the pull chamber is prevented. As a result, the powdery dust can be removed without adhering to the inner surface of the pull chamber.

In the cleaning method for a monocrystal pulling apparatus of the invention, an outer peripheral portion of the sealing member is configured to slide on and clean the inner surface of the pull chamber in a state where the sealing member is in contact with the inner surface of the pull chamber and seals the upper end side of the pull chamber. Accordingly, it is possible to move the sealing member while wiping the inner surface of the pull chamber by sealing the upper end side of the pull chamber with the sealing member before the cleaning of the wire and lowering the upper end of the main tube part while the sealing member is in contact with the inner surface of the pull chamber after the cleaning of the wire. Therefore, the sealing member can slide on the inner surface of the pull chamber and scrape adhering matter off. Accordingly, the inner surface of the pull chamber can be cleaned as a whole after the cleaning of the wire.

Advantageous Effects of Invention

According to the invention, the main tube part, which can continuously extend in a sealed state, is inserted into the pull chamber even though the pull chamber is present at a high position. Accordingly, the wire, which causes dust to be generated, can be cleaned by the wire cleaning mechanism and the inner surface of the pull chamber to be exposed to silicon melt during pull can be isolated from a dust source to be cleaned. Accordingly, since it is possible to clean the wire while preventing powdery dust from adhering again, and it is possible to obtain an effect of significantly suppressing the influence (the dislocation of a crystal, and the like) of powdery dust on pull and growth of the monocrystal. In addition, the inner surface of the pull chamber can be cleaned by the inner surface cleaning mechanism. Accordingly, since the inner surface of the pull chamber is easily cleaned without manual work while powdery dust is prevented from adhering again, it is possible to obtain an effect of suppressing the influence (the dislocation of a crystal, and the like) of powdery dust on pull and growth of the monocrystal.

REFERENCE SIGNS LIST

Figure 1:
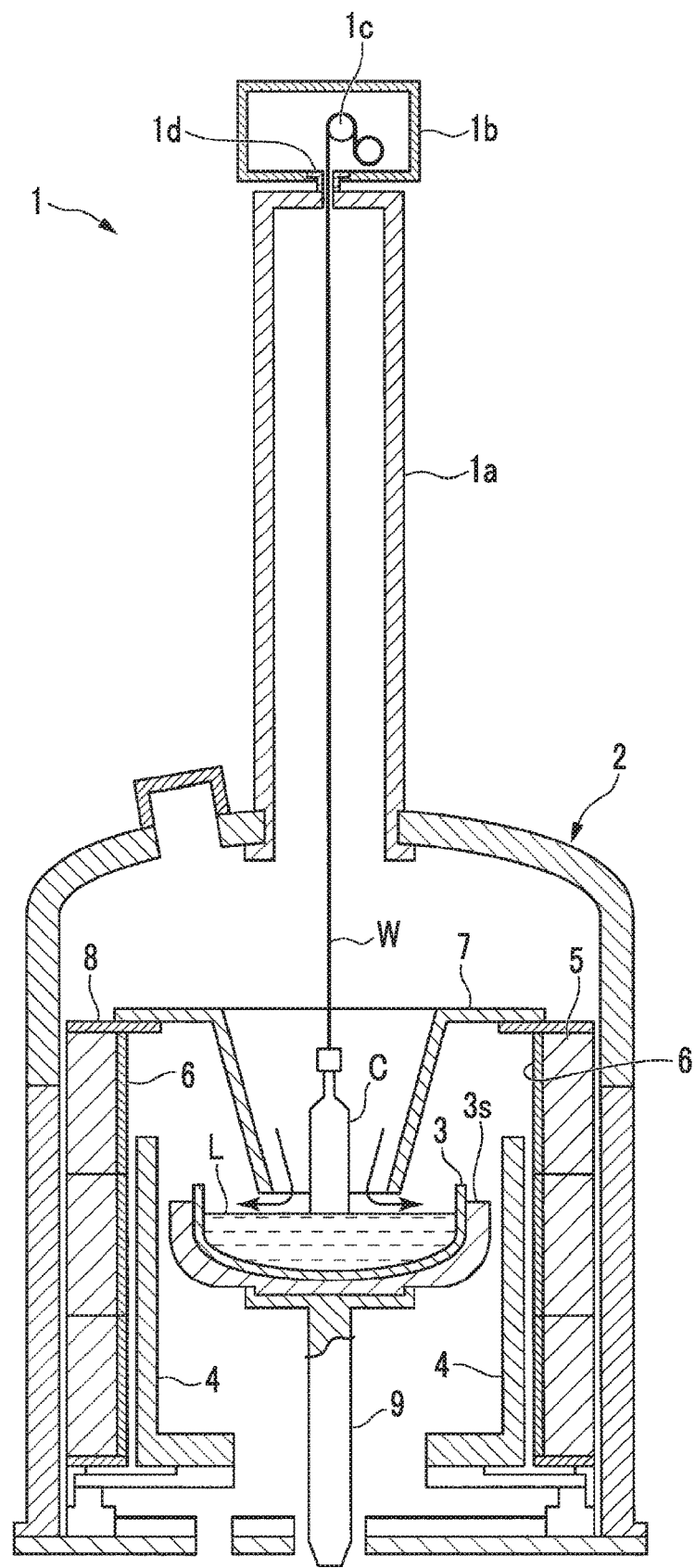
FIG. 1 is a front cross-sectional view of a monocrystal pulling apparatus, which is to be cleaned, in a first embodiment of a cleaning device for a monocrystal pulling apparatus according to the invention.

1: monocrystal pulling apparatus
1a: pull chamber
1b: pull head
1c: winding device
1d: centerpiece portion
1f: pull head suction pipe
1g: pull head suction unit
2: chamber
W: wire
SH: seed holder
SC: seed chuck
10: cleaning device
11: main tube part
11A: first joint tube part (joint tube part)
11B: second joint tube part (joint tube part)
11C: third joint tube part (joint tube part)
11D: fourth joint tube part (joint tube part)
11Ba to 11Da: upper end
11Ab to 11Db: lower end
11Aa: flange portions
11Db: bottom portion
11Dc: suction hole
11Dd: window portion
11b: sealing portion
12: locking unit
12a: hook
12b: base
12c: lever
12d: catch.
14: handle (tube support portion)
14a: inclined surface
13: internal air-blowing mechanism (wire cleaning mechanism)
13a, 13b: internal nozzle (internal blowing port)
13c: blowing-air supply pipe
13d: valve
13e: particle filter
13f: mist oil filter
13g: coupler
15: gas suction pipe
18: sealing member
18a, 18b: end portion
18c: inner joint portion
18d, 18e: both folded portions
21: external communication-suction portion.

21a, 21b: through-hole
23: variable diameter mechanism
24: rubber tube (flexible bag body)
25: pressurization pipe
D: carriage (support base)
D0: bottom plate
D2: position-regulating plate
D21: notch
D3: position-setting portion
D4: wheel
D10: support part
D11: plate body
D12: arm portion
D13: groove
D11A: support raising/lowering part
D11B: guide

DESCRIPTION OF EMBODIMENTS

A first embodiment a cleaning device for a monocrystal pulling apparatus according to the invention will be described below with reference to drawings.

FIG. 1 is a front cross-sectional view of a monocrystal pulling apparatus that is to be cleaned by a cleaning device of this embodiment, and reference numeral 1 denotes the monocrystal pulling apparatus in FIG. 1.

The monocrystal pulling apparatus 1 according to this embodiment is to perform pull and growth of the monocrystal using Czochralski (CZ) method. As shown in FIG. 1, the monocrystal pulling apparatus 1 according to this embodiment includes a chamber 2 that is a sealed vessel, a pull chamber 1a that is provided at an upper portion of the chamber 2, a susceptor 3s that is provided in the chamber 2 and is made of carbon, a quartz crucible that is disposed on the susceptor 3s, a cylindrical heater 4 that is disposed around the quartz crucible 3 and is made of carbon, a cylindrical heat-insulating tube that is disposed around the heater 4 made of carbon, a carbon plate 6 that is provided on the inner surface of the heat-insulating tube 5 as a support plate, a flow pipe 7 that is disposed above the quartz crucible 3, an annular upper ring 8 that supports the flow pipe 7, and a shaft 9 that supports the susceptor 3s and is movable up and down.

The monocrystal pulling apparatus 1 further includes a wire W that is suspended in the pull chamber 1a and is made of tungsten (W) or the like, a pull head 1b that is rotatably and that is provided on the pull chamber 1a, and a winding device 1c for the wire W, and the winding device 1c is provided in the pull head 1b. The wire W is suspended into the pull chamber 1a from the pull head 1b through a centerpiece portion 1d that is a hole allowing the pull head 1b and the pull chamber 1a to communicate with each other.

Figure 2:
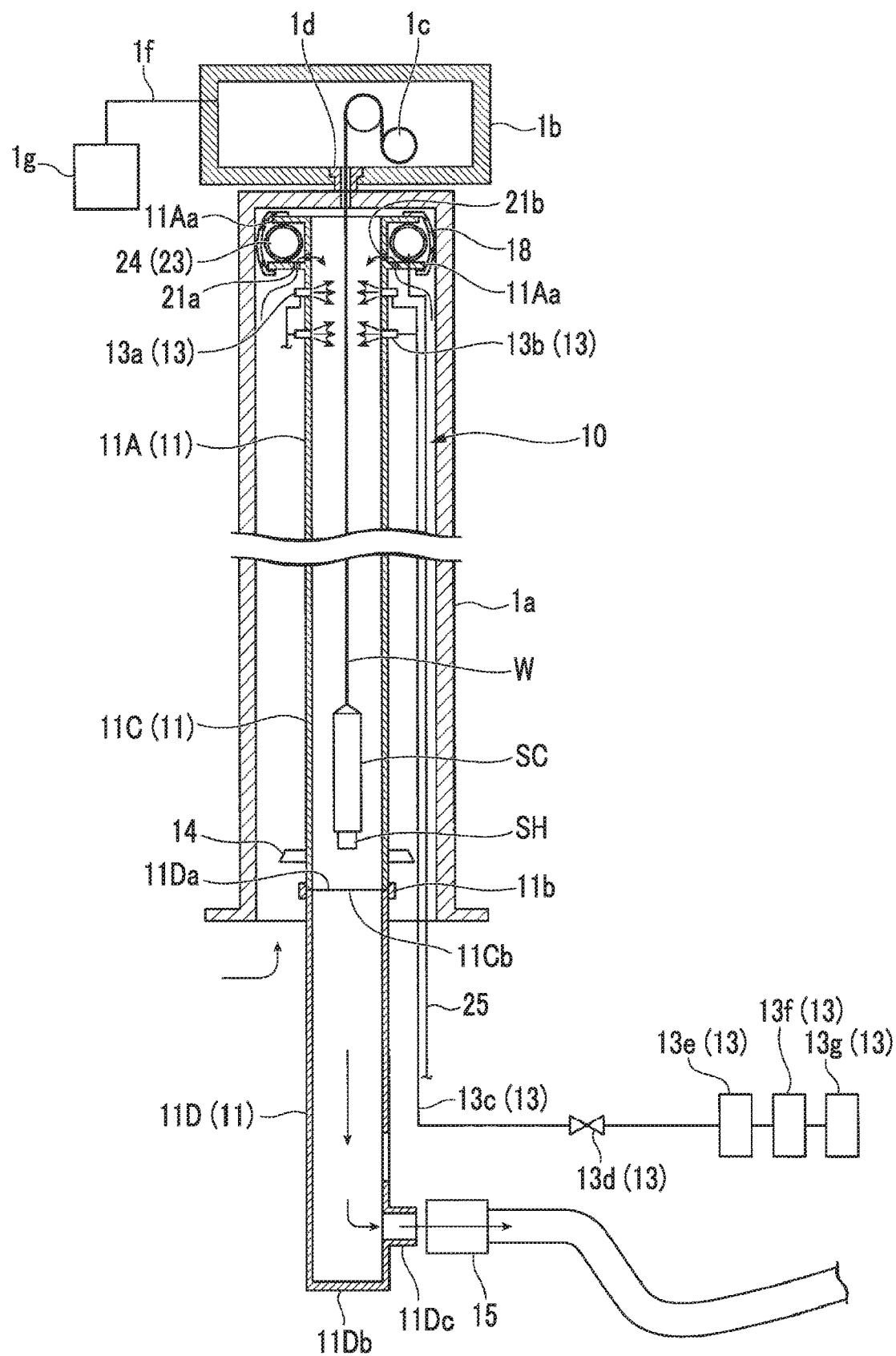
FIG. 2 is a front cross-sectional view showing a state where a main tube part is joined in the first embodiment of the cleaning device for a monocrystal pulling apparatus according to the invention.

As shown in FIG. 2, a seed holder SH that holds a seed crystal and is made of carbon and a seed chuck SC that is made of molybdenum are mounted at the lower end of the wire W. Further, a pull head suction unit 1g is connected to the pull head 1b through a pull head suction pipe 1f, so that pressure in the pull head 1b can be reduced.

To perform pull and growth of the monocrystal by the monocrystal pulling apparatus 1, first, the chamber 2 is opened and the quartz crucible is filled with a semiconductor material, such as silicon, forming semiconductor melt L. Then, after the chamber 2 is sealed and predetermined gas atmosphere is set in the chamber 2, heating is performed up to a predetermined temperature by the heater 4 to melt the semiconductor material, the semiconductor melt L is stored in the quartz crucible 3, and the heating of the semiconductor melt L up to a predetermined temperature is controlled by the heater 4. In this state, a semiconductor monocrystal C is pulled from the semiconductor melt L, which is stored in the crucible 3 disposed below the pull chamber 1a, by the wire W that is suspended in the pull chamber 1a provided at the upper portion of the chamber 2. The pulled semiconductor monocrystal C is taken out and sent to a process for manufacturing a wafer, and the like. After the pull ends, the pull chamber 1a is detached from the chamber 2 and is cleaned by the cleaning device of this embodiment.

Figure 3:
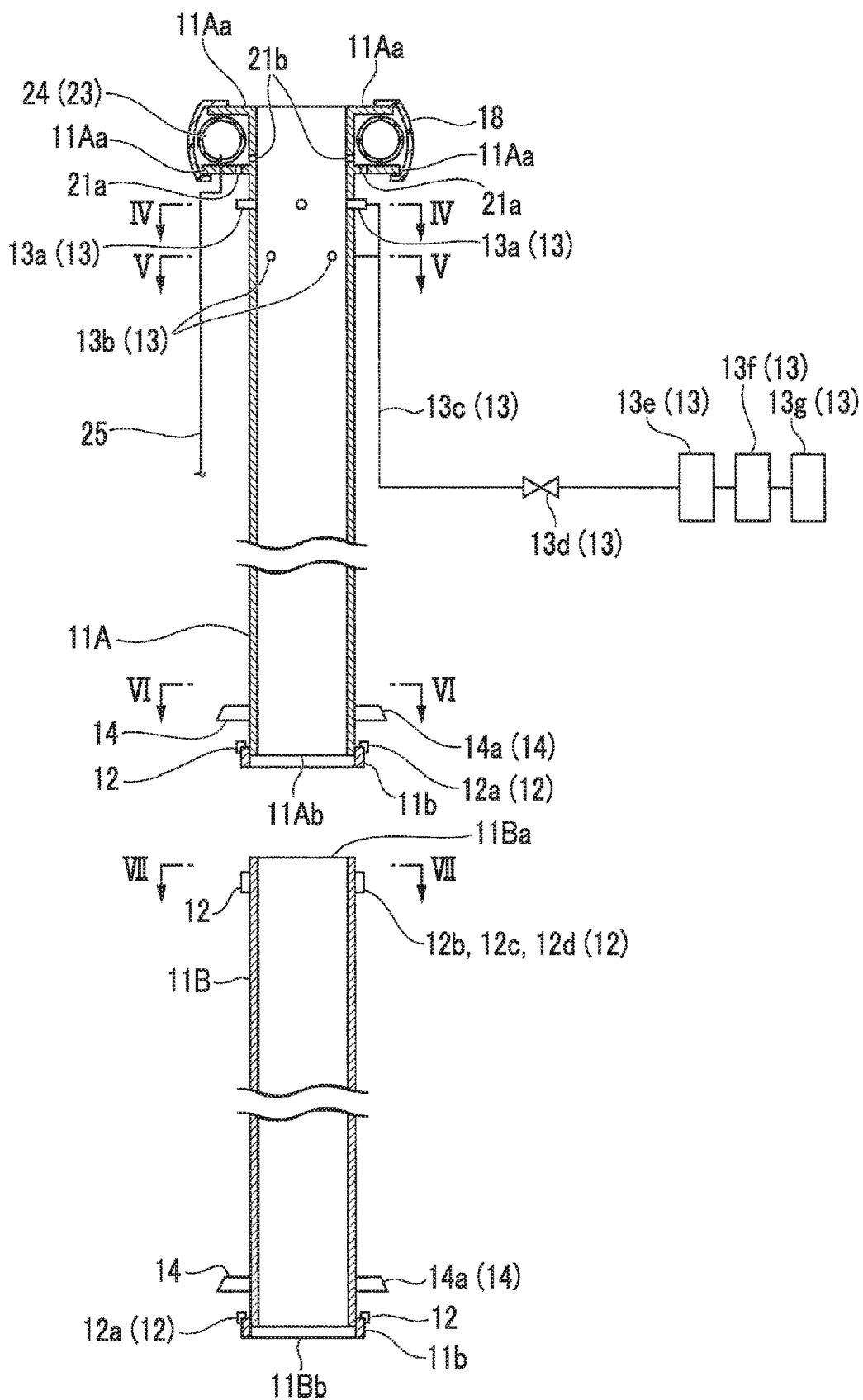
FIG. 3 is an exploded front cross-sectional view showing an upper portion of the main tube part in the first embodiment of the cleaning device for a monocrystal pulling apparatus according to the invention.
Figure 4:
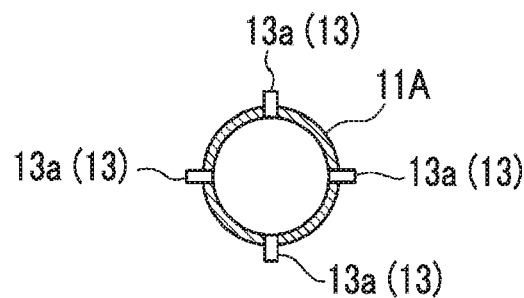
FIG. 4 is a cross-sectional view of a joint tube part of FIG. 3 taken along line IV-IV.
Figure 5:
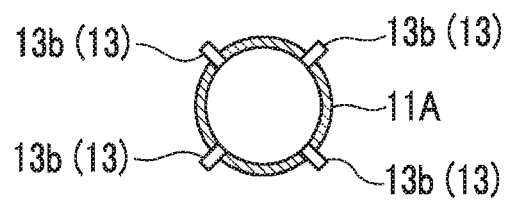
FIG. 5 is a cross-sectional view of the joint tube part of FIG. 3 taken along line V-V.
Figure 6:
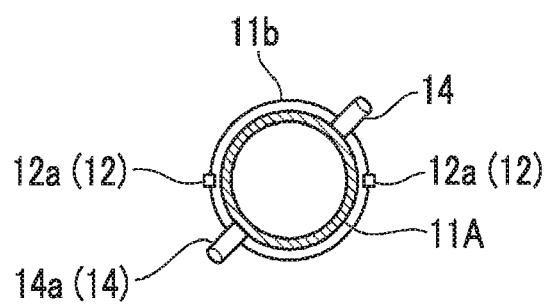
FIG. 6 is a cross-sectional view of the joint tube part of FIG. 3 taken along line VI-VI.
Figure 7:
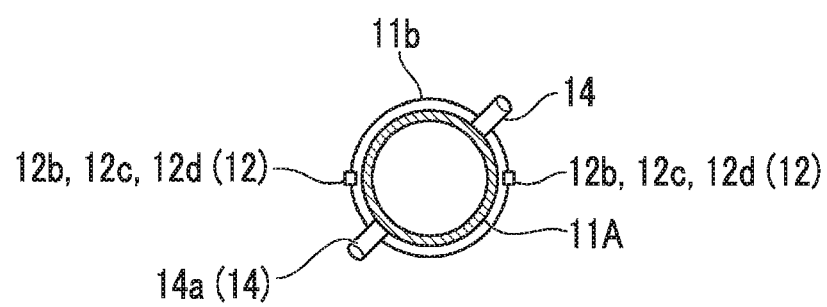
FIG. 7 is a cross-sectional view of the joint tube part of FIG. 3 taken along line VII-VII.
Figure 8:
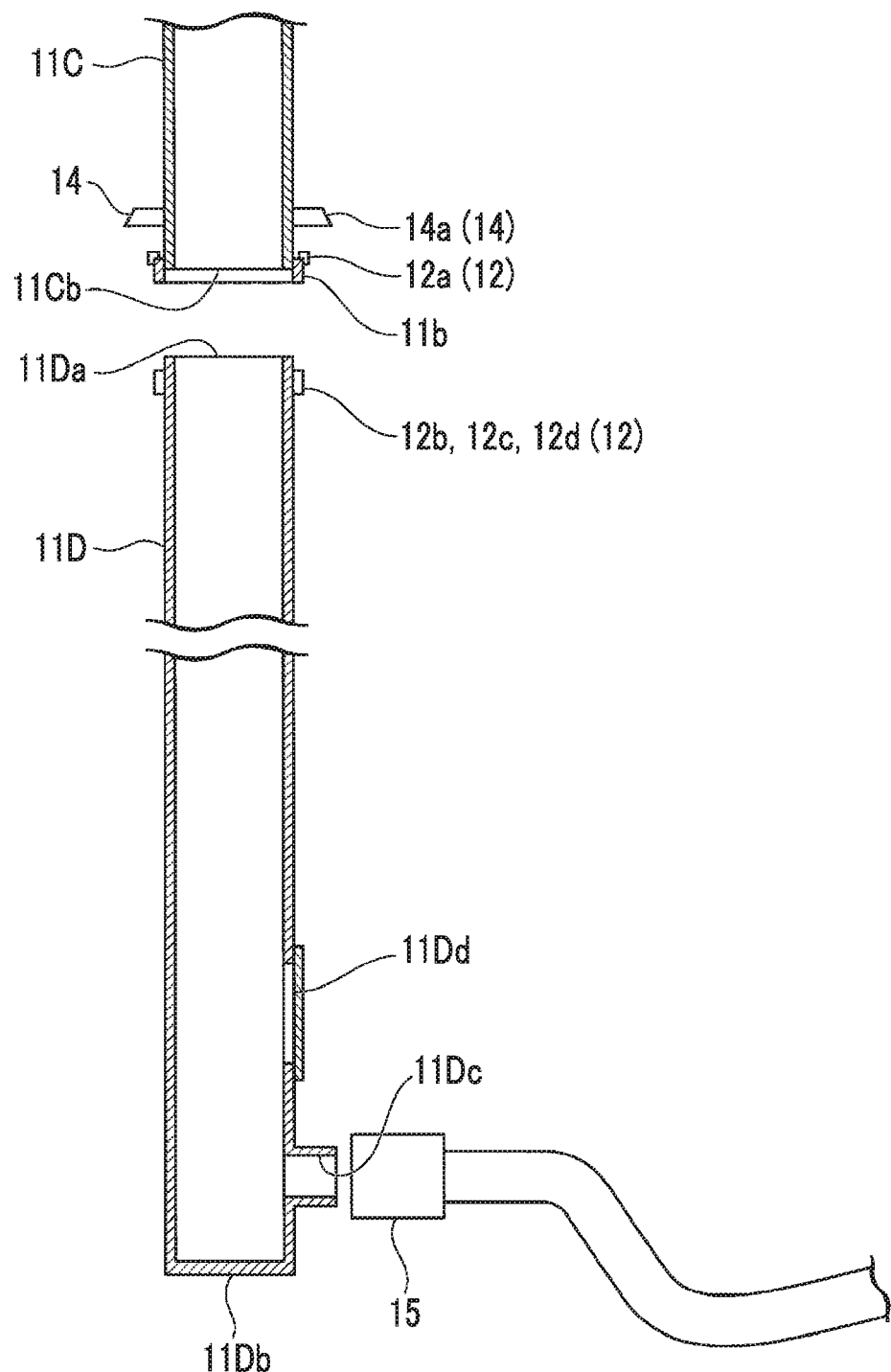
FIG. 8 is an exploded front cross-sectional view showing a lower portion of the main tube part in the first embodiment of the cleaning device for a monocrystal pulling apparatus according to the invention.

FIG. 2 is a front cross-sectional view showing a state where a main tube part of the cleaning device of this embodiment is joined and is inserted into the pull chamber, FIG. 3 is an exploded front cross-sectional view showing an upper portion of the main tube part of the cleaning device of this embodiment, FIGS. 4 to 7 are cross-sectional views of the main tube part of FIG. 3 taken along lines, FIG. 8 is an exploded front cross-sectional view showing a lower portion of the main tube part of the cleaning device of this embodiment, and reference numeral 10 denotes the cleaning device in the drawings.

As shown in FIGS. 2 to 8, the cleaning device 10 of this embodiment includes a main tube part 11 which can be inserted into the pull chamber 1a and in which the wire W can be inserted, and an internal air-blowing mechanism (wire cleaning mechanism) 13 that can blow air inward in a radial direction from a plurality of internal nozzles (internal blowing ports) 13a and 13b provided in the main tube part 11.

The main tube part 11 is made of a lightweight resin, for example, vinyl chloride, and has a quadripartite structure including a first joint tube part 11A, a second joint tube part 11B, a third joint tube part 11C, and a fourth joint tube part 11D that can be repeatedly joined to and detached from each other in an axial direction and are arranged in this order from above as shown in FIGS. 2 to 8. The number of divided pieces of the main tube part 11 can be set according to the diameter and length of a semiconductor monocrystal C that is to be pulled by the monocrystal pulling apparatus 1, the length of the pull chamber 1a, and the length of the joint tube parts 11A to 11D that are easy to use.

As shown in FIGS. 2 to 8, the joint tube parts 11A to 11D are formed in the shape of a cylinder having the same diameter and can be added and joined to each other in a state where the end portions of the respective joint tube parts butt against each other and a sealed state is maintained in the joint tube parts. Each of the joint tube parts 11A to 11D is formed in the shape of a cylinder having substantially the same diameter over the entire length thereof in the axial direction.

As shown in FIGS. 2 to 8, a ring-shaped sealing portion 11b, which extends downward in the axial direction and is increased in diameter, is provided around a lower end 11Ab of the first joint tube part 11A. Likewise, a ring-shaped sealing portion 11b, which extends downward in the axial direction and is increased in diameter, is provided around each of a lower end 11Bb of the second joint tube part 11B and a lower end 11Cb of the third joint tube part 11C.

The sealing portion 11b forms a continuous extension mechanism, and is formed in a shape allowing the sealing portion 11b to cover the periphery of an upper end 11Ba of the joint tube part 11B, which butts against the lower end 11Ab of the joint tube part 11A, to seal the insides of the joint tube parts 11A and 11B in a case where the joint tube part 11B is continued to the joint tube part 11A as shown in FIGS. 2 to 8.

Likewise, the sealing portion 11b is formed in a shape allowing the sealing portion 11b to cover the periphery of an upper end 11Ca of the joint tube part 11C, which butts against the lower end 11Bb of the joint tube part 11B, to seal the insides of the joint tube parts 11B and 11C in a case where the joint tube part 11C is continued to the joint tube part 11B. Likewise, the sealing portion 11b is formed in a shape allowing the sealing portion 1b to cover the periphery of an upper end 11Da of the joint tube part 11D, which butts against the lower end 11Cb of the joint tube part 11C, to seal the insides of the joint tube parts 11C and 11D in a case where the joint tube part 11D is continued to the joint tube part 11C.

Locking units 12, which form the continuous extension mechanism, are provided at the upper end 11Ba of the joint tube part 11B and the lower end 11Ab of the joint tube part 11A at positions corresponding to each other in a case where the joint tube part 11B is added and joined to the joint tube part 11A.

Figure 9:
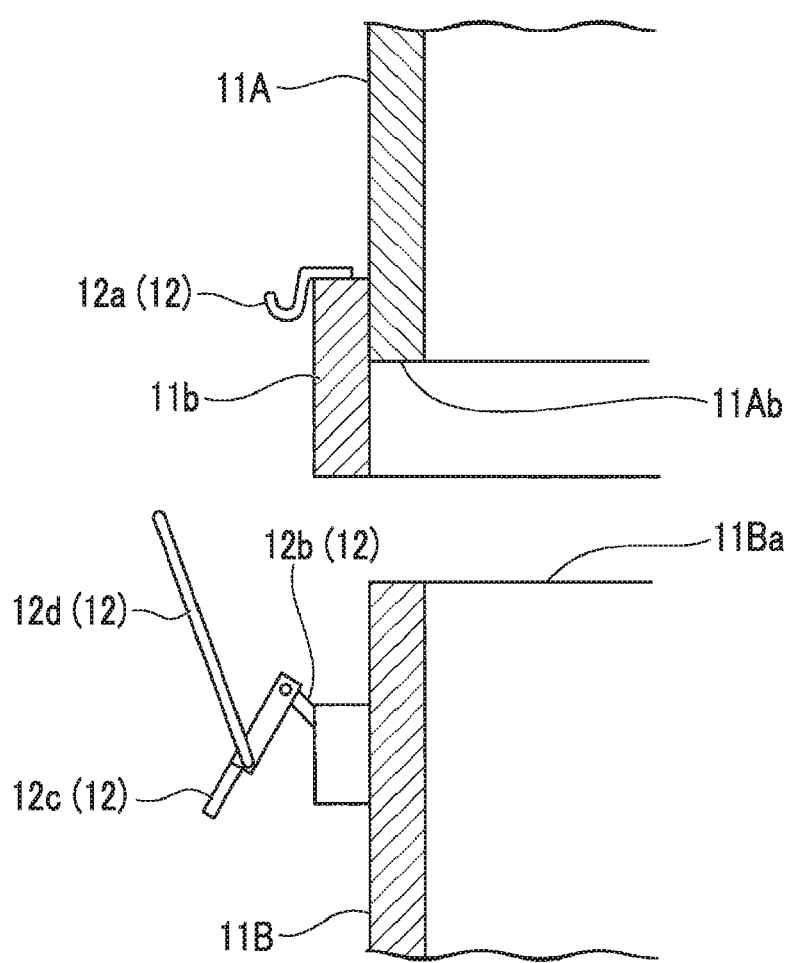
FIG. 9 is a front cross-sectional view showing a state where the locking of the locking unit of the cleaning device of the invention is released.
Figure 10:
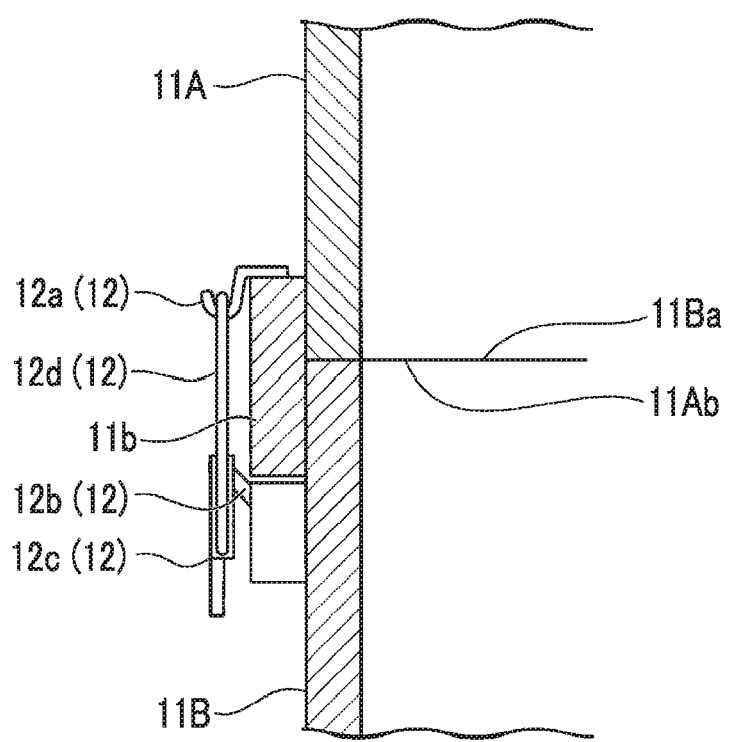
FIG. 10 is a front cross-sectional view showing a state where the locking unit of the cleaning device of the invention is locked.

FIG. 9 is a front cross-sectional view showing a state where the locking of the locking unit of the cleaning device of this embodiment is released, and FIG. 10 is a front cross-sectional view showing a state where the locking unit of the cleaning device of this embodiment is locked.

As shown in FIGS. 3 to 10, each locking unit 12 can lock/release the joint tube part 11A to/from the joint tube part 11B across the sealing portion 11b, and is formed of a so-called draw latch.

As shown in FIGS. 3 to 8, the locking units 12 are disposed opposite to each other in radial direction in each of the joint tube parts 11A and 11B, that is, the locking units 12 are disposed at two positions that are opposite to each other on the diameter in plan view.

As shown in FIGS. 9 and 10, the draw latch (locking unit) 12 includes a hook 12a that is provided on the joint tube part 11A and a base 12b, a lever 12c, and a catch 12d that are provided on the joint tube part 11B.

The hook 12a is provided at a position over the sealing portion 11b at the position of the lower end 11Ab of the joint tube part 11A. The base 12b is provided at the position of the upper end 11Ba of the joint tube part 11B and at a lower position where the base 12b does not inhibit sealing to be performed by the sealing portion 11b in a case where the main tube part 11 is added and joined.

The base 12b and the lever 12c are connected to each other so as to be rotatable about an axis, and the catch 12d and the lever 12c are connected to each other so as to be rotatable about an axis. The catch 12d is adapted to be elastically deformable for locking.

In a case where the catch 12d is to be engaged with the hook 12a in the draw latch (locking unit) 12 as shown in FIGS. 9 and 10, a force is applied to the lever 12c from the upper side to rotate the lever 12c with respect to the base 12b and the joint tube parts 11A and 11B are drawn to a locking position together by the catch 12d. Basically, a latch operation is to rotate the lever 12c to shift the pivot-connecting portion between the catch 12d and the lever 12c from a line between the hook 12a and the pivot-connecting portion between the lever 12c and the base 12b.

Likewise, as shown in FIGS. 3 to 8, locking units 12 are provided at the upper end 11Ca of the joint tube part 11C and the lower end 11Bb of the joint tube part 11B at positions corresponding to each other in a case where the joint tube part 11C is added and joined to the joint tube part 11B.

Likewise, as shown in FIGS. 3 to 8, locking units 12 are provided at the upper end 11Da of the joint tube part 11C and the lower end 11Bb of the joint tube part 11C at positions corresponding to each other in a case where the joint tube part 11D is added and joined to the joint tube part 11C.

As shown in FIGS. 2 to 8, handles (tube support portions) 14, which protrude in the radial direction, are provided at positions above the sealing portion 11b at the lower end 11Ab of the first joint tube part 11A.

As shown in FIGS. 2 to 8, the handles (tube support portions) 14 are disposed opposite to each other in radial direction in each of the joint tube parts 11A and 11B, that is, the handles 14 are disposed at two positions that are opposite to each other on the diameter in plan view in each joint tube part. Further, the handles (tube support portions) 14 are disposed at positions that are shifted from the locking units 12 in the circumferential direction of the joint tube part 11A. An angle, which is formed between the handle (tube support portion) 14 and the locking unit 12 from the axis of the joint tube part 11A, is set to about 45° in this embodiment.

The length of portions of the handles 14, which protrude from the outer periphery of the first joint tube part 11A in the radial direction, are set so that an interval between the tips of the handles 14 facing each other along a diameter is set to be smaller than the inner diameter of the pull chamber 1a and the tips of the handles 14 do not come into contact with the inner surface of the pull chamber 1a as shown in FIG. 2.

An inclined surface 14a is provided at the tip of each handle (tube support portion) 14 so as to become far from the axis of the joint tube part 11A downward from above. Since the interval between the tips of the handles facing each other along a diameter is reduced upward due to the inclined surfaces 14a, it is possible to easily prevent the tips of the handles 14 from coming into contact with the inner surface of the pull chamber 1a in a case where the first joint tube part 11A is to be inserted into the pull chamber 1a.

Likewise, as shown in FIGS. 2 to 8, handles (tube support portions) 14 are provided at positions above the sealing portion 11b at the lower end 11Bb of the joint tube part 11B so as to protrude in the radial direction. Likewise, handles (tube support portions) 14 are provided at positions above the sealing portion 11b at the lower end 11Cb of the joint tube part 11C so as to protrude in the radial direction.

Among the joint tube parts 11A to 11D, the joint tube parts 11B and 11C provided at an intermediate position have substantially the same shape as shown in FIGS. 2 to 8.

As shown in FIGS. 2 and 3, the first joint tube part 11A, which is disposed at the upper position, of the main tube part 11 is provided with the wire cleaning mechanism 13.

As shown in FIGS. 2 to 5, the wire cleaning mechanism (internal air-blowing mechanism) 13 includes four internal nozzles 13a that are arranged at the same height on the inner peripheral surface of an upper portion of the first joint tube part 11A at regular intervals in the circumferential direction, and four internal nozzles 13b that are arranged below the internal nozzles 3a at regular intervals in the circumferential direction likewise so as to be shifted from the internal nozzles 13a by a eighth part of the circumference. The four internal nozzles 13a and the four internal nozzles 13b are provided as two-stage internal nozzles 13a and 13b in the axial direction in the wire cleaning mechanism 13.

The internal air-blowing mechanism 13 includes a blowing-air supply pipe 13c of which a tip is connected to the respective internal nozzles 13a, a particle filter 13e and a mist oil filter 13f are provided on an intermediate portion of the blowing-air supply pipe 13c through a valve 13d, and a coupler 13g to be connected to an air supply source (not shown) for cleaning is provided at a base end of the blowing-air supply pipe 13c.

In the internal air-blowing mechanism 13, all the internal nozzles 13a and 13b are provided to be flush with the inner surface of the first joint tube part 11A. Accordingly, since there is no portion protruding into the first joint tube part 11A, it is possible to prevent the seed chuck SC and the like from coming into contact with the inner surface of the main tube part 11 in a case where the main tube part 11 is to be raised or a case where the wire W is to be raised and lowered.

Since the internal nozzles 13a and 13b and the blowing-air supply pipe 13c are formed to be smaller than flange portions 11Aa or a sealing member 18 in the radial direction, the contact between the inner surface of the pull chamber 1a and the internal nozzles 13a and 13b and the blowing-air supply pipe 13c is prevented.

As shown in FIGS. 2 and 3, the first joint tube part 11A is provided with a sealing member 18 that is disposed on the outer peripheral surface of the upper end of the first joint tube part 11A and can be in contact with the inner surface of the pull chamber 1a in a state where the main tube part 11 is inserted into the pull chamber 1a.

Figure 11:
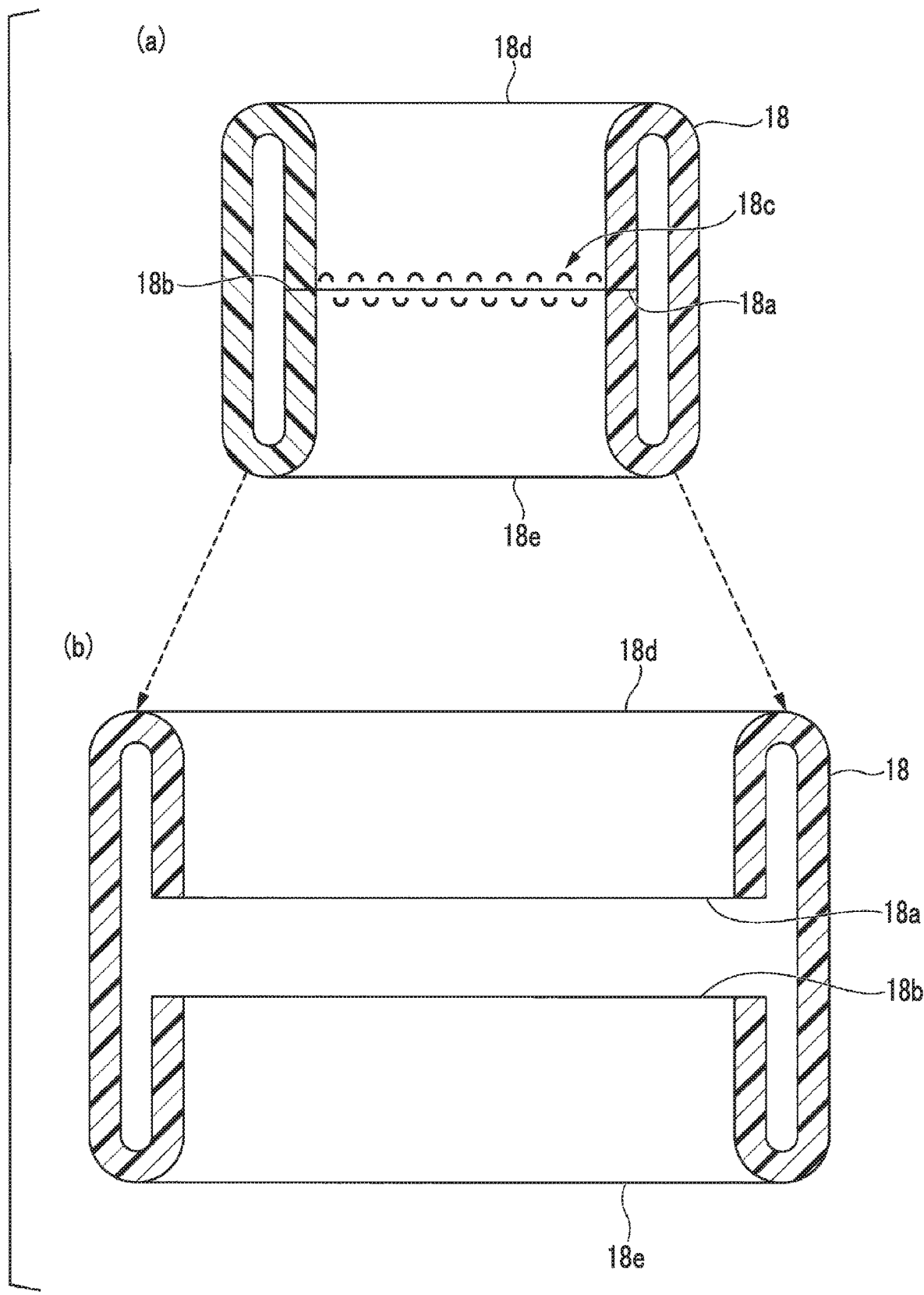
In FIG. 11, (a) is a cross-sectional view showing the reduced-diameter state of a sealing member and (b) is a cross-sectional view showing the increased-diameter state of the sealing member in the first embodiment of the cleaning device for a monocrystal pulling apparatus according to the invention.

(a) of FIG. 11 is a cross-sectional view showing the reduced-diameter state of the sealing member of the cleaning device of this embodiment and (b) of FIG. 11 is a cross-sectional view showing the increased-diameter state of the sealing member.

Further, the sealing member 18 is made of polyester or the like, and is doubly folded back so as to form an annular shape along the inner peripheral surface of the pull chamber 1a. Specifically, the sealing member 18 formed of, for example, an elastic cloth body that is knitted in a tubular shape by a circular knitting machine or the like. The sealing member 18 is folded back inward so that both end portions 18a and 18b of the tubular cloth body face each other as shown in (a) of FIG. 11, and is formed in a toroidal shape (annular shape) through an inner joint portion 18c where these end portions 18a and 18b are elastically connected to each other.

In this case, portions of the tubular cloth body positioned near both folded portions 18d and 18e are mounted on the outer peripheral end portions of the upper and lower flange portions 11Aa in a state where the inner joint portion 18c faces the inside of a torus not being in contact with the inner surface of the pull chamber 1a.

The sealing member 18 can cope with a pull chamber 1a having a different diameter.

For example, in a case where the sealing member 18 is to be applied to clean the pull chamber 1a having a small diameter as in a monocrystal pulling apparatus 1 for pulling a semiconductor monocrystal C having a diameter of φ200 mm, the sealing member 18 is used in the reduced-diameter state where both the end portions 18a and 18b are connected to each other through the inner joint portion 18c as shown in (a) of FIG. 11.

In addition, in a case where the sealing member 18 is to be applied to clean the pull chamber 1a having a large diameter as in a monocrystal pulling apparatus 1 for pulling a semiconductor monocrystal C having a diameter of, for example, φ300 mm, the sealing member 18 is used in the increased-diameter state where the joining between the end portions 18a and 18b through the inner joint portion 180 is released to increase an elastic modulus and to increase the width as shown in (b) of FIG. 11. In this case, the sealing member 18 can be used as one layer over the entire width thereof.

The sealing member 18 is a wiper member, and can remove adhering powdery dust and the like while sliding on the inner surface of the pull chamber 1a. For this reason, the sealing member 18 can function as sealing members of the wire cleaning mechanism and can also function as an inner surface cleaning mechanism.

The first joint tube part 11A includes a variable diameter mechanism 23 that deforms or moves the sealing member 18 in the radial direction of the main tube part 11.

The variable diameter mechanism 23 includes a rubber tube (flexible bag body) 24 that is provided between the sealing member 13 and the outer peripheral surface of the upper end of the first joint tube part 11A and is provided in an annular shape along the outer peripheral surface of the upper end portion of the first joint tube part 11A.

The rubber tube 24 is put between the two flange portions 11Aa provided at the upper end of the first joint tube part 11A, and the sealing member 18 is mounted on the two flange portions 11Aa in a state where the sealing member 18 is loose vertically. The sealing member 18 may be directly provided on the outer peripheral surface of the rubber tube 24. Further, a pressurization pipe 25 is connected to the rubber tube 24, and is connected to a pressurized-air supply source (not shown). That is, since air is injected into the rubber tube 24 from the pressurized-air supply source through the pressurization pipe 25, the rubber tube 24 can be inflated arbitrarily.

As shown in FIGS. 2 and 3, the first joint tube part 11A is provided with an external communication suction portion 21.

Through-holes 21a that are provided at the lower flange portion 11Aa and through-holes 21b that are formed on the inner surface of the first joint tube part 11A between the two flange portions 11Aa are provided as the external communication-suction portion 21.

The through-holes 21a are arranged on the lower flange portion 11Aa so as to be closer to the central axis of the first joint tube part 11A than the rubber tube 24. A space, which is formed between the two flange portions 11Aa communicate with the outside of the first joint tube part 11A through the through-holes 21a.

A plurality of through-holes 21a are arranged at the same height in the circumferential direction of the first joint tube part 11A.

The through-holes 21b are provided on the inner surface of the first joint tube part 11A at height positions between the two flange portions 11Aa so as to be closer to the lower flange portion 11Aa than the rubber tube 24. The inside of the first joint tube part 11A communicate with the space that is formed between the two flange portions 11Aa through the through-holes 21b.

Further, the height positions of the through-holes 21b are set to be higher than those of the internal nozzles 13a.

Since the inner space of the first joint tube part 11A, the space formed between the two flange portions 11Aa, and the outside of the main tube part 11 in the circumferential direction communicate with each other through the through-holes 21a and 21b, air flowing in from the outside of the main tube part 11 in the circumferential direction is jetted from the through-holes 21b toward the center of the first joint tube part 11A in a case where negative pressure is generated in the main tube part 11. Accordingly, it is possible to block the flow of air upward from a position below the through-holes 21b by air, which is jetted from the through-holes 21b, like an air curtain.

A bottom portion 11Db of the fourth joint tube part 11D, which is disposed at the lower position, of the main tube part 11 is closed as shown in FIGS. 2 and 8. Further, a suction hole 11Dc to which a gas suction pipe 15 used to suck air present in the main tube part 11 to the outside is to be connected is provided at the side portion of the lower end portion of the fourth joint tube part 11D, and a window portion 11Dd, which allows the inside of the main tube part 11 to be observed through a transparent member provided on the side surface of the fourth joint tube part 11D, is provided at a portion of the fourth joint tube part 11D above the suction hole 11Dc.

The gas suction pipe 15 is connected to an exhaust unit (not shown), and can exhaust the main tube part 11.

Figure 12:
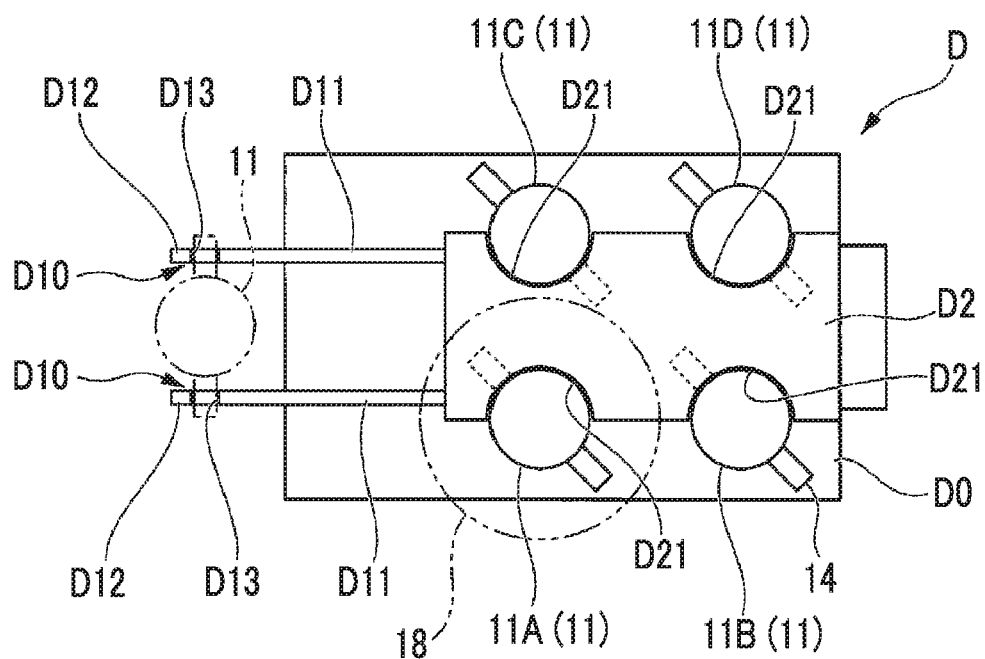
FIG. 12 is a top view showing a state where the main tube part of the cleaning device of the invention is stored.
Figure 13:
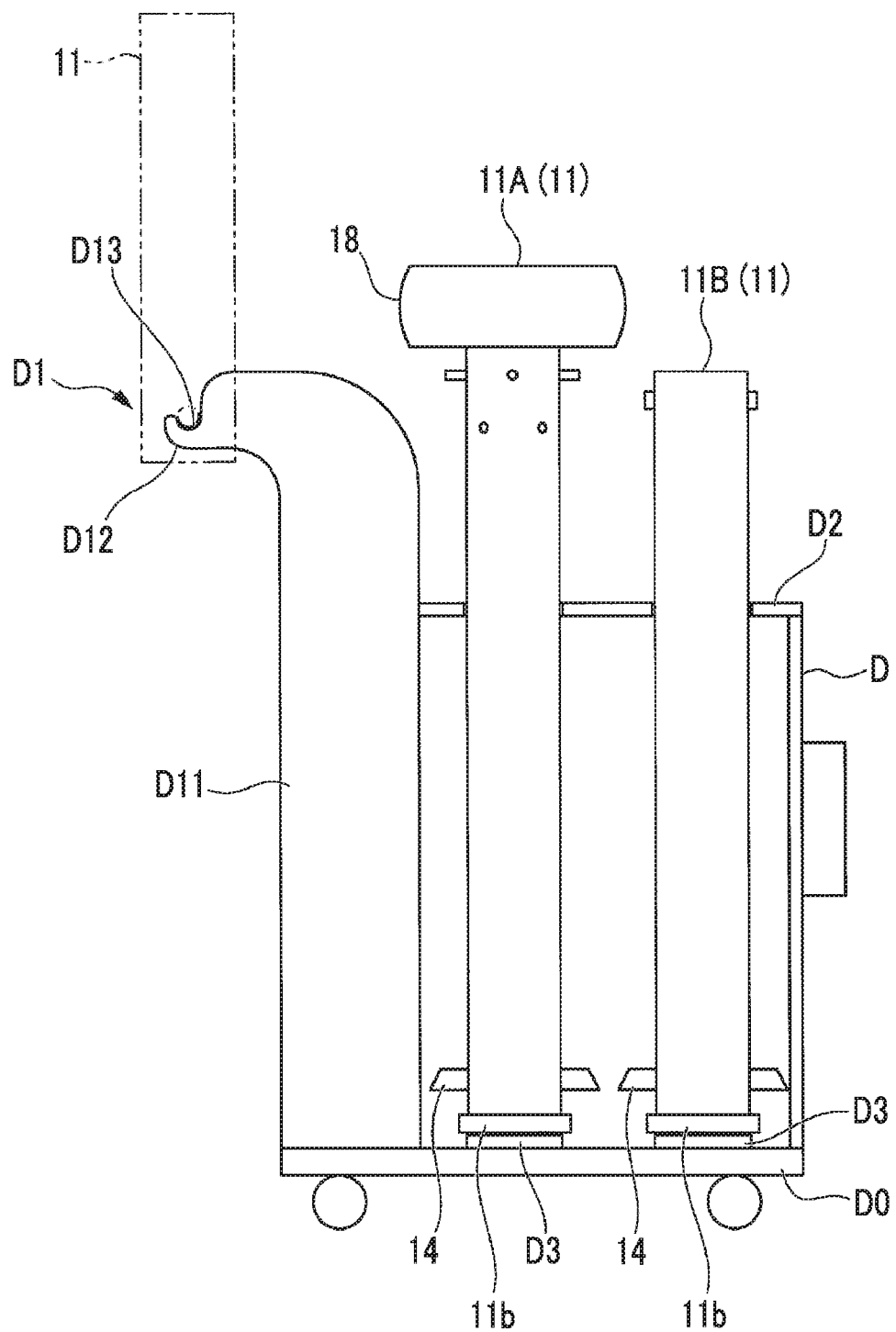
FIG. 13 is a front view showing a state where the main tube part of the cleaning device of the invention is stored.

FIG. 12 is a top view showing a state where the main tube part of the cleaning device of this embodiment is stored, and FIG. 13 is a front view showing a state where the main tube part of the cleaning device of this embodiment is stored.

As shown in FIGS. 12 and 13, the joint tube parts 11A to 11D can be placed and stored in a carriage D in a state where each of the joint tube parts 11A to 11D is separated and standing up.

As shown in FIGS. 12 and 13, the carriage (support base) D includes support parts D10 that form the continuous extension mechanism.

The support parts D10 can support the handles 14 that are provided near the lower ends 11Ab to 11Cb of the respective joint tube parts 11A to 11C.

The carriage D includes arm portions D12 and D12, which protrude in a horizontal direction, of two plate bodies D11 and D11 that stand on a bottom plate D0 so as to be spaced apart from each other in parallel, and grooves D13 and D13 are formed at tip portions of the arm portions D12 and D12.

An interval between the two plate bodies D11 and D11 is set to be larger than the outer diameter of each of the joint tube parts 11A to 11C and smaller than the interval between the tips of the handles 14 facing each other along the diameter.

Further, the height of the groove D13 can be set to a height that allows the joint tube parts 11B to 11D to be added and joined from below to butt against each other and allows the joint tube parts 11B to 11D to be locked by the locking units 12 in a state where the handles 14 are placed in the grooves D13. For this reason, it is preferable that the arm portions D12 protrude outward more than the outline of the bottom plate D0 of the carriage D in plan view.

For example, in a case where the handles 14 and 14 protruding outward to both sides in the radial direction are placed in the grooves D13 and D13, respectively, in a state where the lower end 11Ab of the joint tube part 11A is positioned between the plate bodies D11 and D11, the support parts D10 can support the joint tube part 11A in a state where the flange portions 11Aa provided at the upper end of the joint tube part 11A are inserted into the pull chamber 1a from below.

In this state, the upper end 11Ba of the joint tube part 11B is inserted into the sealing portion 11b of the joint tube part 11A to be in contact with the lower end 11Ab of the joint tube part 11A, and can be connected to the lower end 11Ab of the joint tube part 11A by the locking units 12.

The joint tube parts 11A to 11D can be stored in the carriage D in a state where the joint tube parts 11A to 11D stand and the positions of the joint tube parts 11A to 11D are regulated by position-setting portions D3 and notches D21. The position-setting portions D3 are provided on the bottom plate D0 as protruding portions or recessed portions, and the notches D21 are provided at a position-regulating plate D2 that is provided parallel to the bottom plate D0 at a position where the height from the bottom plate D0 is equal to or larger than about a half of the height of each of the joint tube parts 11A to 11D. Further, wheels D4 are provided under the carriage D as moving members.

Next, a method of cleaning the wire N and the inner surface of the pull chamber 1a of the monocrystal pulling apparatus 1 by the cleaning device 10 of this embodiment will be described.

First, a main body portion of the chamber 2 and the upper portion are separated from each other, and the support parts D10 of the carriage D are disposed below the pull chamber 1a. In this case, the main tube part 11 of the cleaning device 10 is placed on the carriage D in a state where the main tube part 11 is divided into the respective joint tube parts as shown in FIGS. 12 and 13.

Then, the first joint tube part 11A of the cleaning device 10 is inserted into the pull chamber 1a, the first joint tube part 11A is raised in a state where the first joint tube part 11A is inserted, and the handles (tube support portions) 14 of the first joint tube part 11A are placed in the grooves D13.

Next, the second joint tube part 11B is disposed below the first joint tube part 11A in the state where the first joint tube part 11A is inserted as described above. In this state, the upper end 11Ba of the joint tube part 11B is inserted into the sealing portion 11b of the joint tube part 11A to be in contact with the lower end 11Ab of the joint tube part 11A, and is connected to the lower end 11Ab of the joint tube part 11A by the locking units 12.

In addition, likewise, the first and second joint tube parts 11A and 11B integrated with each other are raised in a state where the first and second joint tube parts 11A and 11B are inserted, and the handles (tube support portions) 14 of the second joint tube part 11B are placed in the grooves D13.

Next, the third joint tube part 11C is disposed below the second joint tube part 11B in the state where the first joint tube part 11A is inserted as described above. In this state, the upper end 11Ca of the joint tube part 11C is inserted into the sealing portion 11b of the joint tube part 11B to be in contact with the lower end 11Bb of the joint tube part 11B, and is connected to the lower end 11Bb of the joint tube part 11B by the locking units 12.

Likewise, the first, second, and third joint tube parts 11A, 11B, and 11C integrated with each other are raised a state where the first, second, and third joint tube parts 11A, 11B, and 11C are inserted, and the handles (tube support portions) 14 of the third joint tube part 11C are placed in the grooves D13.

Next, the fourth joint tube part 11D is disposed below the third joint tube part 11C in the state where the first joint, tube part 11A is inserted as described above.

In this state, the upper end 11Da of the joint tube part 11D is inserted into the sealing portion 11b of the joint tube parts 11C to be in contact with the lower end 11Cb of the joint tube parts 11C, and is connected to the lower end 11Cb of the joint tube parts 11C by the locking units 12.

Accordingly, a state where the main tube part 11 is continued to the maximum length in the axial direction is made.

In this state, air is sent to the rubber tube 24 from the pressurized-air supply source through the pressurization pipe 25 and inflates the rubber tube 24. In this case, the sealing member 18 is deformed so as to be extruded outward in the radial direction by the inflated rubber tube 24, and is pressed against the inner peripheral surface of the pull chamber 1a. Accordingly, a state where the inside of the main tube part 11, the outer space of the main tube part 11 in the pull chamber 1a, and the outer space of the pull chamber 1a are separated from each other is made as shown in FIG. 2. Therefore, a state where the inner surface of a portion of the pull chamber 1a, which is positioned below a portion with which the sealing member 18 is in contact circumferentially, is isolated from the inner space of the main tube part 11 is made.

In this state, the gas suction pipe 15 is connected to the suction hole 11Dc, air present in the main tube part 11 is sucked by the exhaust unit, and air present in the pull head 1b is sucked by the pull head suction unit 1g, so that the inner space of the main tube part 11 and the inner space of the pull head 1b are set to substantially the same negative pressure. Accordingly, a state where air does not flow into the pull chamber 1a from the centerpiece portion 1d is made.

Since the external communication-suction portion 21 is provided, in this state, clean air flowing in from the outer space passes through an opening, which is provided at the lower end of the pull chamber 1a, and is jetted from the through-holes 21b toward the center of the first joint tube part 11A through an outer space that is present outside the main tube part 11 in the circumferential direction, the through-holes 21a, the space that is formed between the two flange portions 11Aa, and the through-holes 21b as shown in FIG. 2.

Accordingly, an air curtain is formed at the height of the through-holes 21b by air jetted from the through-holes 21b, and blocks the flow of air upward from a position below the through-holes 21b. Air, which is jetted from the through-holes 21b, is air that has cleanliness of the outside of the monocrystal pulling apparatus 1, that is, a clean room. Further, a downward laminar flow is formed in the main tube part 11, so that air present in the main tube part 11 is efficiently discharged.

In this state, the winding device 1c is driven to insert the wire W into the main tube part 11. In addition, after the coupler 13g and the air supply source for cleaning are connected to each other, compressed air is supplied to the blowing-air supply pipe 13c from the air supply source and is blown to the wire W from the respective internal nozzles 13a and 13b through the particle filter 13e and the mist oil filter 13f.

In this case, air is blown over the entire circumference of the wire W from the respective internal nozzles 13a and 13b in a wide range in the axial direction, so that powdery dust present on the surface of the wire W can be blown off. Particularly, since the seed chuck SC provided at the lower end of the wire W functions as a weight, vibration is generated on the wire W by air blown to the wire W. For this reason, powdery dust more easily falls. In this case, it is possible to clean the entire wire W by moving the wire W up and down several times with the winding device 1c.

Generated powdery dust is discharged from the inside of the main tube part 11 without being in contact with the inner surface of the pull chamber 1a by a laminar flow that is formed downward to the suction hole 11Dc from the through-holes 21b in the axial direction in the main tube part 11, of which the airtight state is maintained, by the exhaust unit connected to the gas suction pipe 15. Accordingly, powdery dust generated due to cleaning does not adhere to the inner surface of the pull chamber 1a again.

Furthermore, in a case where the main tube part 11 and the pull chamber 1a are moved up and down relative to each other in a state where the sealing member (wiper member) 18 is pressed against the inner peripheral surface of the pull chamber 1a, the sealing member (wiper member) 18 can slide on the inner peripheral surface of the pull chamber 1a and scrape adhering matter off.

Moreover, in a case where the amount of matter adhering to the inner peripheral surface of the pull chamber 1a is large, and the like, if necessary, the locking of the locking units 12 released and the locking units 12 are locked again to separate the fourth joint tube part 11D from the third joint tube part 11C, to separate the third joint tube part 11C from the second joint, tube part 11B, and to connect the fourth joint tube part 11D to the second joint tube part 11B again and the sealing member (wiper member) 18 can be made to slide on the inner peripheral surface of the pull chamber 1*a* at a low position to scrape adhering matter off.

Likewise, the locking of the locking units 12 is released and the locking units 12 are locked again to separate the fourth joint tube part 11D from the second joint, tube part 11B and to separate the second joint tube part 11B from the first joint tube part 11A, and to connect the fourth joint tube part 11D to the first joint tube part 11A again and the sealing member (wiper member) can also be made to slide on the inner peripheral surface of the pull chamber 1*a* at a lower position to also scrape adhering matter off.

In a case where the fourth joint tube part 11D is to be separated and is to be connected again, the jet of air from the through-holes 21*b* can also be maintained.

Further, in a case where the fourth joint tube part 11D is to be separated and is connected again, the fourth joint tube part 11D is separated and connected again in a state where the handles (tube support portions) 14 are placed in the grooves D13.

Since it is possible to separate the sealing member (wiper member) 18 from the inner peripheral surface of the pull chamber 1*a* by deflating the rubber tube 24 in cases other than a case where the inside of the main tube part 11 is to be sealed, it is possible to smoothly insert the main tube part 11 into the pull chamber 1*a* or to smoothly take the main tube part 11 out of the pull chamber is without the obstruction of the sealing member (wiper member) 18 in a case where the main tube part 11 is to be inserted into and set in the pull chamber 1*a* or is to be taken out of the pull chamber 1*a*.

As described above, in the cleaning device 10 of this embodiment, the main tube part 11 is inserted into the pull chamber 1*a* and air is blown to the wire W positioned in the main tube part 11 from the internal nozzles 13*a* and 13*b* by the internal air-blowing mechanism 13 even though the pull chamber 1*a* is present at a high position. Accordingly, powdery dust can be blown off and removed from the surface of the wire W. Further, since the inner peripheral surface of the pull chamber 1*a* is separated from air including powdery dust by the external communication-suction portion 21, the sealing member 18, and the main tube part 11 that is in an airtight state, it is possible to prevent powdery dust, which is generated due to cleaning, from adhering to the inner surface of the pull chamber 1*a* again. Furthermore, the sealing member (wiper member) 18 can scrape adhering matter off by scraping the inner peripheral surface of the pull chamber 1*a*. Accordingly, it is possible to effectively suppress the influence (the dislocation of a crystal, and the like) of powdery dust on pull and growth of the monocrystal.

Further, since the main tube part 11 can be continued in the axial direction in a sealed state, the length of the main tube part 11 in the axial direction can be increased, the internal air-blowing mechanism 13 can be made to reach the upper portion of the pull chamber 1*a*, and the cleaning of the wire W can be performed at the position of the upper end of the pull chamber 1*a*. Since the main tube part 11 is separated to be reduced in length in a case where the cleaning device is not used, the handeability, such as transport or storage, of the cleaning device is improved.

The quartz crucible 3 can be filled with a silicon raw material during the cleaning of the wire of this embodiment, and the pull chamber 1*a* and the chamber 2 can be assembled after cleaning.

Next, a second embodiment of the cleaning device for a monocrystal pulling apparatus according to the invention will be described with reference to drawings.

This embodiment is different from the above-mentioned first embodiment in terms of a support part raising/lowering mechanism. Corresponding components other than the support part raising/lowering mechanism will be denoted by the same reference numerals as those of the first embodiment, and a description thereof will be omitted.

Figure 14:
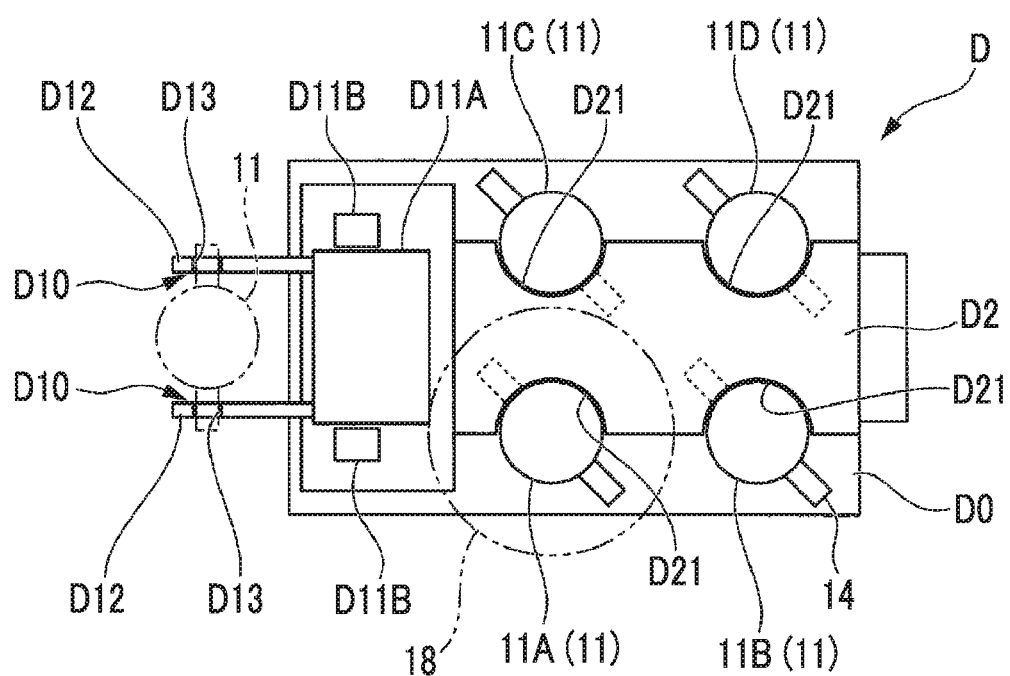
FIG. 14 is a top view showing a state where a main tube part is stored in a second embodiment of the cleaning device for a monocrystal pulling apparatus according to the invention.
Figure 15:
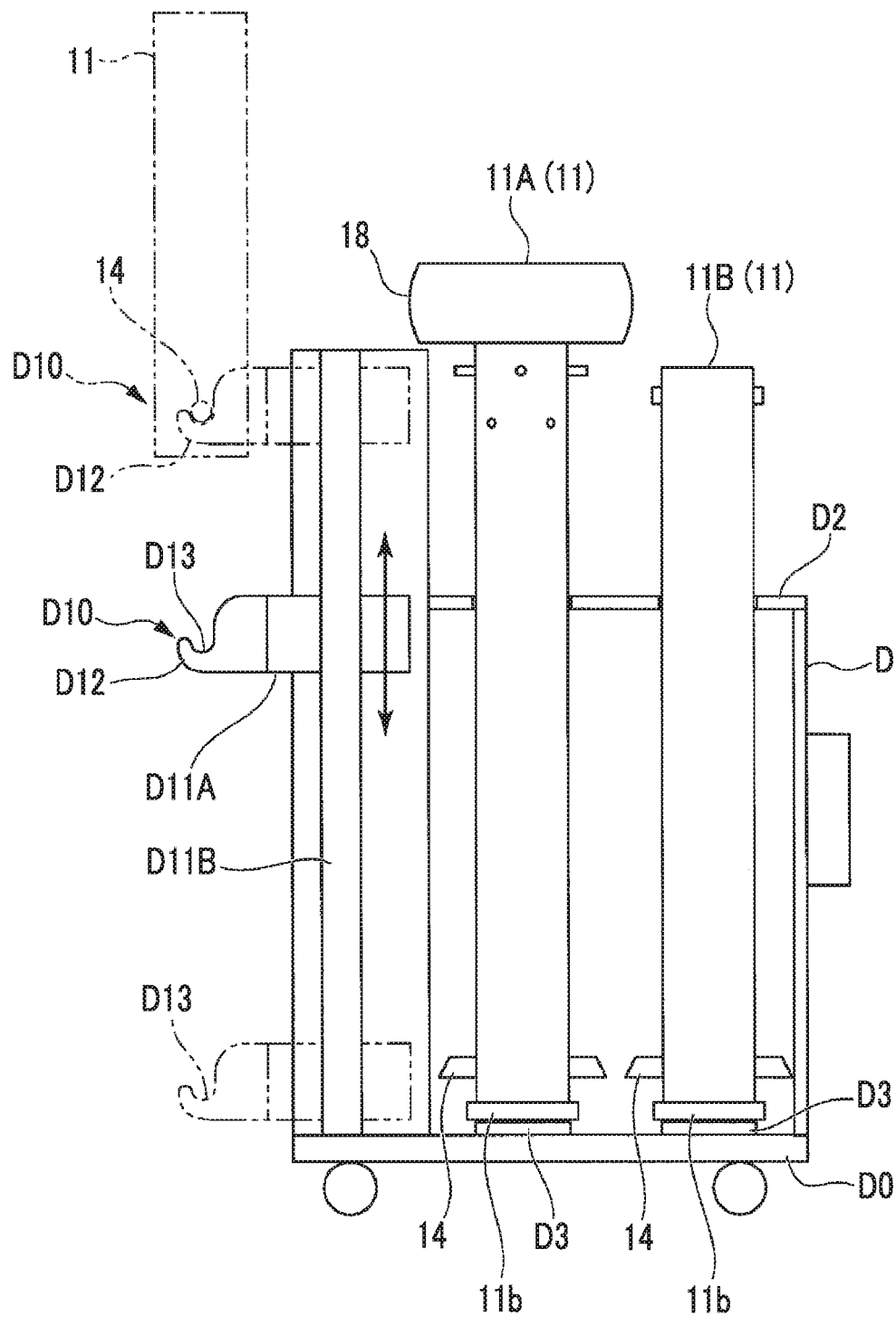
FIG. 15 is a front view showing a state where the main tube part is stored in the second embodiment of the cleaning device for a monocrystal pulling apparatus according to the invention.

FIG. 14 is a top view showing a state where a main tube part of the cleaning device of this embodiment is stored, FIG. 15 is a front view showing a state where the main tube part of the cleaning device of this embodiment is stored, and reference numeral D11A denotes a support raising/lowering part.

As shown in FIGS. 14 and 15, the support raising/lowering part D11A can be driven in a vertical direction by drive members (not shown) in a state where the support raising/lowering part D11A is regulated to be moved in the vertical direction by guides D11B standing on the bottom plate D0 of the carriage D. The arm portions D12 and D12 are mounted on the support raising/lowering part D11A so as to extend outward in the horizontal direction, and are movable up and down as a single body by the movement of the support raising/lowering part D11A.

In this embodiment, in a state where the handles 14 and 14 are placed in the grooves D13 and D13, respectively, the support raising/lowering part D11A is raised and lowered to move the arm portions D12 and D12 up and down to an arbitrary position. Accordingly, the joint tube parts 11A to 11C can be automatically raised and lowered. For example, the handles 14 are placed in the grooves D13 and the support raising/lowering part D11A can be raised at the lowest position of the movable range of the support raising/lowering part D11A during work for repeatedly joining the joint tube parts.

When the joint tube parts 11B to 11D are to be connected from below, the main tube part 11 can also be held at a predetermined height in a case where the rubber tube 24 is inflated to press the sealing member (wiper member) 18 against the inner peripheral surface of the pull chamber 1*a* during work for connecting the joint tube parts 11B to 11D.

In addition, the support part raising/lowering mechanism of this embodiment and the support parts D10 can also be provided together.

A third embodiment of the cleaning device for a monocrystal pulling apparatus according to the invention will be described with reference to a drawing.

Figure 16:
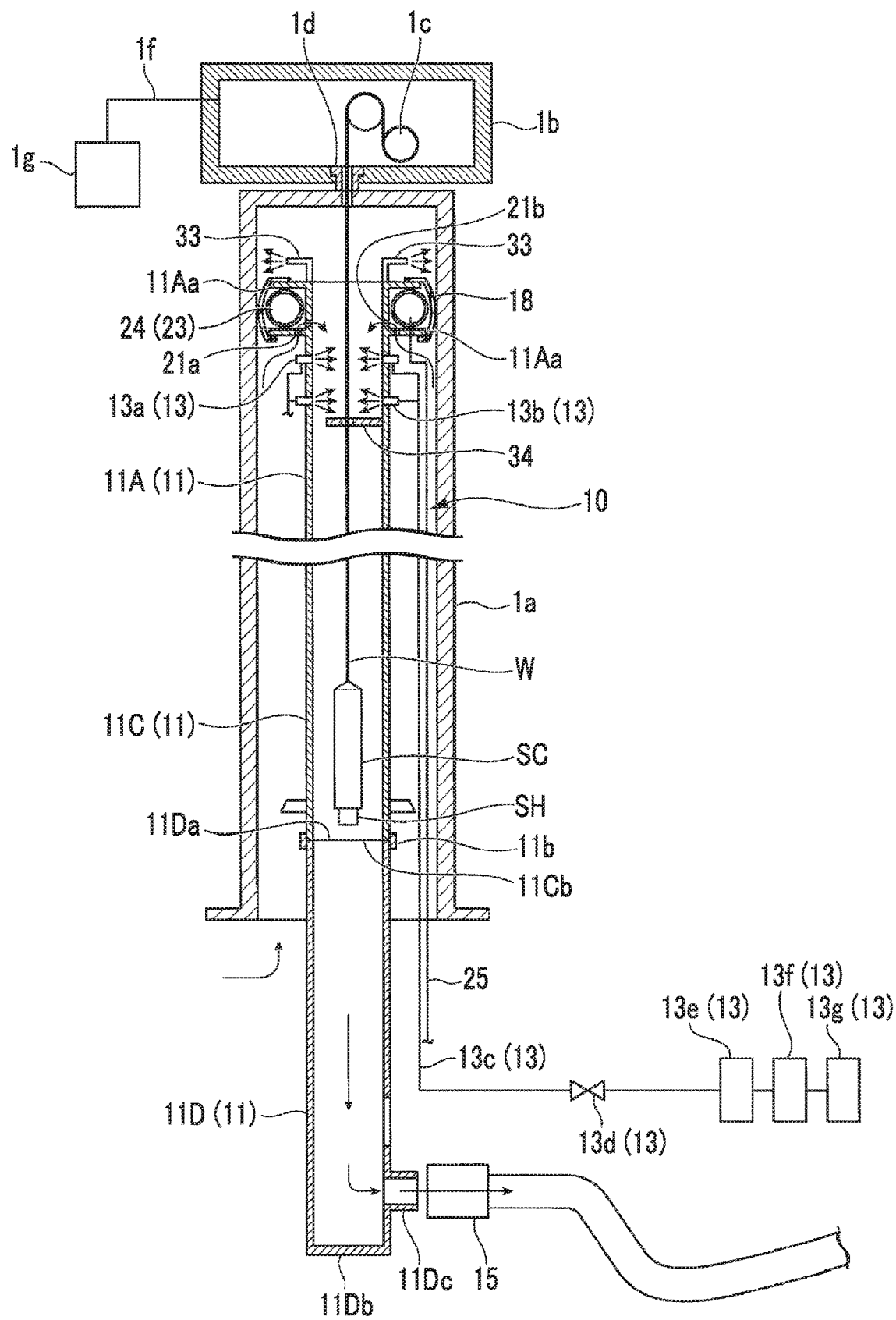
FIG. 16 is a front cross-sectional view showing a state where a main tube part is joined in a third embodiment of the cleaning device for a monocrystal pulling apparatus according to the invention.

FIG. 16 is a front cross-sectional view showing a state where a main tube part of this embodiment is inserted into the pull chamber 1*a*.

This embodiment is different from the above-mentioned first and second embodiments in terms of external nozzles (external blowing ports) 33 and a vibrating member 34. Corresponding components other than the external nozzles and the vibrating member will be denoted by the same reference numerals as those of the first and second embodiments, and a description thereof will be omitted.

Only the internal nozzles 13*a* and 13*b*, which blow air to the wire W, are provided in the first and second embodiments. However, as shown in FIG. 16, the cleaning device 10 of this embodiment includes an external air blowing mechanism including a plurality of external nozzles (external blowing ports) 33 that are provided at the upper portion of the first joint tube part 11A and can blow air to the outside in the radial direction. In addition, a vibrating member 34, which is in contact with the wire W disposed in the main tube part 11 and applies vibration to the wire W, is provided on the inner surface of the main tube part 11 in this embodiment.

In this embodiment, each external nozzle 33 is connected to the blowing-air supply pipe 13c as with the internal nozzles 13a and 13b. The external nozzles 33 can blow matter, which adheres to the inner surface of the pull chamber 1a, off by blowing jetted air to the inner peripheral surface of the pull chamber 1a.

Further, a downward laminar flow is formed over the entire length of the main tube part 11 by air jetted from the respective external nozzles 33, so that air present in the main tube part 11 efficiently discharged. Air, which is supplied from the blowing-air supply pipe 13c, is air that has cleanliness having the same level as the cleanliness of the outside of the monocrystal pulling apparatus 1, that is, a clean room.

In this case, since the external nozzles 33 can take the place of the external communication-suction portion 21, the through-holes 21a and 21b may not be provided.

In the cleaning device 10 of this embodiment, powdery dust generated due to cleaning does not adhere to the inner surface of the pull chamber 1a again and matter adhering to the inner surface of the pull chamber 1a can be reduced.

Further, in this embodiment, the vibrating member 34 is a rod-like member connected to a vibration source, such as a motor, (not shown) and is provided to be movable in the main tube part 11 so that the tip portion of the vibrating member 34 can be in contact with and be spaced apart from the wire W. Accordingly, since the wire W further vibrated in a case where the vibrating member 34 is in contact with the wire W, adhering powdery dust can be made to more easily fall.

The through-holes 21a and 21b have been provided as the external communication-suction portion 21 in the embodiment, but only the through-holes 21b can also be formed at a position closer to the internal nozzles 13a than the lower flange portion 11Aa in the axial direction of the joint tube part 11A. Even in this structure, clean air present outside is easily introduced into the main tube part 11.

In the embodiment, the four internal nozzles 13a and the four internal nozzles 13b have been provided in the circumferential direction so as to form two stages in the axial direction as the internal air blowing mechanism 13. However, the number of the stages of the internal nozzles in the axial direction and the number of the internal nozzles in the circumferential direction can also be arbitrarily set according to a cleaning effect and the like.

The invention claimed is:

1. A cleaning device for cleaning an inside of a monocrystal pulling apparatus that is configured to pull a semiconductor monocrystal from semiconductor melt stored in a crucible installed below a pull chamber by a wire suspended in the pull chamber of a sealed vessel, the device comprising:
   a main tube part that is capable of being inserted into the pull chamber; and
   a wire cleaning mechanism that is provided at an upper portion of the main tube part and is configured to clean the wire to be inserted into the main tube part,
   wherein the main tube part includes a continuous extension mechanism that adds together and joins a plurality of joint tube parts in an axial direction and allows the plurality of joint tube parts to be sealed and connected to each other, and
   each of the plurality of joint tube parts has a cylinder shape and a diameter of each of the plurality of tube parts is the same as each other.

2. The cleaning device for a monocrystal pulling apparatus according to claim 1, wherein the wire cleaning mechanism includes an internal air-blowing mechanism that is capable of blowing air inward in a radial direction from an internal blowing port provided in the main tube part.

3. The cleaning device for a monocrystal pulling apparatus according to claim 2, wherein the internal air-blowing mechanism is provided to be flush with an inner surface of the main tube part.

4. The cleaning device for a monocrystal pulling apparatus according to claim 3, wherein the main tube part includes an external communication-suction portion that is provided above the internal air-blowing mechanism and communicates with an outside of the main tube part.

5. The cleaning device for a monocrystal pulling apparatus according to claim 4, wherein a gas suction pipe, which is configured to suck air present in the main tube part and discharge the air, is provided at a position of a lower end of the main tube part.

6. The cleaning device for a monocrystal pulling apparatus according to claim 2, wherein a sealing member, which is capable of being in contact with an inner surface of the pull chamber and sealing an upper end side of the pull chamber in a state where the main tube part is inserted into the pull chamber during blowing of air from the internal blowing port, is provided on an outer peripheral surface of an upper end of the main tube part.

7. The cleaning device for a monocrystal pulling apparatus according to claim 6, wherein the first joint tube part includes a variable diameter mechanism that is configured to reduce a diameter of the first joint tube part when the sealing member is to be moved in the radial direction of the main tube part and increase the diameter of the sealing member when the sealing member seals the upper end side of the pull chamber.

8. The cleaning device for a monocrystal pulling apparatus according to claim 7, wherein the variable diameter mechanism includes a flexible bag body that is provided between the sealing member and an outer peripheral surface of the main tube part, and the flexible bag body is capable of being inflated by an injection of air.

9. The cleaning device for a monocrystal pulling apparatus according to claim 8, wherein the flexible bag body is a rubber tube that is provided in an annular shape along the outer peripheral surface of the main tube part.

10. The cleaning device for a monocrystal pulling apparatus according to claim 6, wherein the sealing member is an inner surface cleaning mechanism, having an outer peripheral portion of which is configured to slide on the inner surface of the pull chamber and clean the inner surface of the pull chamber.

11. The cleaning device for a monocrystal pulling apparatus according to claim 1, wherein the continuous extension mechanism includes tube support portions that protrude in a radial direction at positions of lower ends of the respective joint tube parts of the main tube part, and a support base that supports the tube support portions when the joint tube parts are added together and joined.

12. A cleaning method for a monocrystal pulling apparatus, of cleaning a wire of the monocrystal pulling apparatus pulling a semiconductor monocrystal from semiconductor melt stored in a crucible installed below a pull chamber by a wire suspended in the pull chamber of a sealed vessel, the method comprising:

inserting a main tube part including a continuous extension mechanism, which is configured to add together and join a plurality of joint tube parts of a cleaning device in an axial direction and allows the plurality of joint tube parts to be sealed and connected to each other, into the pull chamber; and cleaning the wire by blowing air inward in a radial direction from an internal blowing port of an internal air-blowing mechanism provided in the main tube part in a state where the wire is inserted into an upper portion of the main tube part, wherein each of the plurality of joint tube parts has a cylinder shape and a diameter of each of the plurality of tube parts is the same as each other.

13. The cleaning method for a monocrystal pulling apparatus according to claim 12, wherein the continuous extension mechanism includes tube support portions that protrude in the radial direction at positions of lower ends of the respective joint tube parts of the main tube part, and a support base that supports the tube support portions when the joint tube parts are added together and joined, and the main tube part is added and joined to or separated from the pull chamber while the tube support portions are supported by the support base.

14. The cleaning method for a monocrystal pulling apparatus according to claim 12, wherein air is blown from the internal blowing port in a state where the main tube part is inserted into the pull chamber and a sealing member provided on an outer peripheral surface of an upper end of the main tube part is in contact with an inner surface of the pull chamber and seals an upper end side of the pull chamber.

15. The cleaning method for a monocrystal pulling apparatus according to claim 14, wherein air present in the main tube part is sucked from a lower end of the main tube part, and air is blown from an external communication-suction portion that is provided above the internal blowing port and communicates with an outside of the main tube part.

16. The cleaning method for a monocrystal pulling apparatus according to claim 14, wherein an outer peripheral portion of the sealing member is configured to slide on and clean the inner surface of the pull chamber in a state where the sealing member is in contact with the inner surface of the pull chamber and seals the upper end side of the pull chamber.

17. The cleaning method for a monocrystal pulling apparatus according to claim 13, wherein air is blown from the internal blowing port in a state where the main tube part is inserted into the pull chamber and a sealing member provided on an outer peripheral surface of an upper end of the main tube part is in contact with an inner surface of the pull chamber and seals an upper end side of the pull chamber.

18. The cleaning method for a monocrystal pulling apparatus according to claim 17, wherein air present in the main tube part is sucked from a lower end of the main tube part, and air is blown from an external communication-suction portion that is provided above the internal blowing port and communicates with an outside of the main tube part.

19. The cleaning method for a monocrystal pulling apparatus according to claim 17, wherein an outer peripheral portion of the sealing member is configured to slide on and clean the inner surface of the pull chamber in a state where the sealing member is in contact with the inner surface of the pull chamber and seals the upper end side of the pull chamber.

* * * * *